US012608531B1

(12) United States Patent
Singh

(10) Patent No.: US 12,608,531 B1
(45) Date of Patent: Apr. 21, 2026

(54) SYSTEM AND METHOD FOR ROUTING IN AN ELECTRONIC DESIGN USING A LOOPBACK ADAPTER

(71) Applicant: Cadence Design Systems, Inc., San Jose, CA (US)

(72) Inventor: Pratul Kumar Singh, Greater Noida (IN)

(73) Assignee: Cadence Design Systems, Inc., San Jose, CA (US)

(*) Notice: Subject to any disclaimer, the term of this patent is extended or adjusted under 35 U.S.C. 154(b) by 894 days.

(21) Appl. No.: 17/692,324

(22) Filed: Mar. 11, 2022

(51) Int. Cl.
*G06F 30/394* (2020.01)
*G06F 13/42* (2006.01)
(Continued)

(52) U.S. Cl.
CPC ........ *G06F 30/394* (2020.01); *G06F 13/4282* (2013.01); *H04L 69/22* (2013.01); *H04L 69/326* (2013.01); *G06F 2213/0026* (2013.01)

(58) Field of Classification Search
CPC .... G06F 9/30036; G06F 17/16; G06F 7/5443; G06F 9/3888; G06F 15/8046; G06F 2212/455; G06F 9/3001; G06F 9/3851; G06F 12/0811; G06F 2212/1016; G06F 9/3887; G06F 2212/1024; G06F 9/30043; G06F 12/0862; G06F 2212/1008; G06F 9/30038; G06F 9/5077; G06F 2212/302; G06F 9/30145; G06F 9/3836; G06F 9/5066; G06F 12/0888; G06F 15/7839; G06F 2212/6028; G06F 9/30047; G06F 9/4881; G06F 12/0607; G06F 12/0875; G06F 12/1009; G06F 2212/401; G06F 30/327; G06F 7/483; G06F 9/30014; G06F 9/30065; G06F 9/383; G06F 9/5027; G06F 9/522; G06F 12/0215; G06F 12/0246; G06F 12/0802; G06F 12/0804; G06F 12/0857; G06F 12/0866; G06F 12/0891; G06F 12/0895; G06F 12/0897; G06F 2212/1021; G06F 2212/60; G06F 3/0679; G06F 9/3004; G06F 9/3016; G06F 9/3867; G06F 9/3877; G06F 9/38885; G06F 12/0238; G06F 12/0871; G06F 12/0882; G06F 12/0893; G06F 12/12; G06F 12/128; G06F 13/1668; G06F 15/173; G06F 16/24569; G06F 17/18; G06F 2209/509; G06F 2212/1044; G06F 2212/2542; G06F 2212/601;
(Continued)

(56) References Cited

U.S. PATENT DOCUMENTS

| | | | | |
|---|---|---|---|---|
| 10,659,571 B1 * | 5/2020 | Volpe | | H04L 69/22 |
| 2018/0077051 A1 * | 3/2018 | Nainar | | H04L 45/745 |

(Continued)

*Primary Examiner* — Binh C Tat

(74) *Attorney, Agent, or Firm* — Mark H. Whittenberger; Holland & Knight LLP

(57) ABSTRACT

Embodiments include herein are directed towards a loopback adapter. Embodiments may include routing one or more transport layer packets through a routing matrix and communicating with the routing matrix via a plurality of ports. At least one of the plurality of ports may include a loopback adapter. Embodiments may include transmitting, via the loopback adapter, one or more transport layer packets to a storage unit. The loopback adapter may include a unique identifier mapping table in communication with the routing matrix.

14 Claims, 23 Drawing Sheets

(51) Int. Cl.
H04L 69/22 (2022.01)
H04L 69/326 (2022.01)

(58) Field of Classification Search
CPC ....... G06F 2212/6026; G06F 2212/608; G06F 2212/652; G06F 7/575; G06F 7/58; G06F 7/588; G06F 9/30079; G06F 9/30087; G06F 9/3802; G06F 9/3818; G06F 9/5011; G06F 1/324; G06F 1/3275; G06F 1/3287; G06F 12/0806; G06F 12/0837; G06F 12/084; G06F 12/0846; G06F 12/1036; G06F 12/109; G06F 13/24; G06F 2212/151; G06F 2212/657; G06F 3/061; G06F 3/0655; G06F 30/3323; G06F 9/3009; G06F 9/355; G06F 9/3834; G06F 9/3885; G06F 9/5016; G06F 9/5038; G06F 9/505; G06F 9/544; G06F 1/206; G06F 1/26; G06F 1/28; G06F 1/3296; G06F 11/26; G06F 12/0207; G06F 12/0833; G06F 12/0842; G06F 12/0864; G06F 12/0868; G06F 12/1081; G06F 2209/483; G06F 2212/466; G06F 2212/651; G06F 3/0659; G06F 7/523; G06F 8/51; G06F 9/30072; G06F 9/30098; G06F 9/30123; G06F 9/3013; G06F 9/30189; G06F 9/3555; G06F 9/3875; G06F 9/3893; G06F 9/5072; G06F 1/08; G06F 1/14; G06F 1/185; G06F 1/20; G06F 1/3225; G06F 1/3237; G06F 1/3243; G06F 1/3265; G06F 1/329; G06F 11/0721; G06F 11/079; G06F 11/2236; G06F 11/277; G06F 11/3409; G06F 12/0223; G06F 12/0292; G06F 12/04; G06F 12/063; G06F 12/08; G06F 12/0813; G06F 12/0817; G06F 12/0851; G06F 12/0855; G06F 12/0886; G06F 12/1027; G06F 12/121; G06F 12/123; G06F 12/126; G06F 12/1408; G06F 12/1441; G06F 13/4009; G06F 13/4022; G06F 13/4068; G06F 15/0208; G06F 15/163; G06F 15/167; G06F 15/7807; G06F 15/80; G06F 18/213; G06F 18/214; G06F 18/217; G06F 2009/45579; G06F 2009/45583; G06F 2111/20; G06F 2115/10; G06F 2119/06; G06F 2207/4824; G06F 2209/484; G06F 2209/5018; G06F 2209/505; G06F 2212/1048; G06F 2212/1052; G06F 2212/452; G06F 2212/454; G06F 2212/507; G06F 2212/6024; G06F 2212/681; G06F 2212/683; G06F 3/0604; G06F 3/0611; G06F 3/0613; G06F 3/0625; G06F 3/0644; G06F 3/0664; G06F 3/0673; G06F 30/00; G06F 30/20; G06F 30/31; G06F 30/33; G06F 30/39; G06F 7/02; G06F 7/485; G06F 7/4876; G06F 7/49915; G06F 7/49931; G06F 7/49942; G06F 7/49947; G06F 7/50; G06F 7/501; G06F 7/5057; G06F 7/533; G06F 7/5336; G06F 7/5338; G06F 7/535; G06F 7/556; G06F 7/57; G06F 7/582; G06F 7/768; G06F 9/30018; G06F 9/3005; G06F 9/3012; G06F 9/3869; G06F 9/38873; G06F 9/38875; G06F 9/3889; G06F 9/3891; G06F 9/452; G06F 9/455; G06F 9/45558; G06F 9/48; G06F 9/4843; G06F 9/5055; G06F 9/5061; G06F 9/5083; G06F 9/5094; G06F 9/542; G06F 9/546; H01L 25/0652; H01L 25/0655

USPC ................................... 716/126–131, 126–133
See application file for complete search history.

(56) References Cited

U.S. PATENT DOCUMENTS

| | | | | |
|---|---|---|---|---|
| 2018/0083871 A1* | 3/2018 | Filsfils | .................. | H04L 45/02 |
| 2018/0367388 A1* | 12/2018 | Pani | ................... | H04L 41/0895 |
| 2018/0367404 A1* | 12/2018 | Harneja | ............. | G06F 9/45558 |
| 2018/0367449 A1* | 12/2018 | Pani | ......................... | H04L 41/40 |
| 2019/0196744 A1* | 6/2019 | Kim | ...................... | H10B 43/10 |
| 2019/0296744 A1* | 9/2019 | Wallichs | ........... | H03K 19/0008 |

* cited by examiner

10 enabling data transmission between plurality of protocol adapters, each of the protocol adapters including one ingress port and one egress port, wherein the ingress port of each of the plurality of protocol adapters maintains an active connection with a single egress port at one time

202 transmitting data between the plurality of protocol adapters using a distributed routing matrix that provides an interface between the plurality of protocol adapters

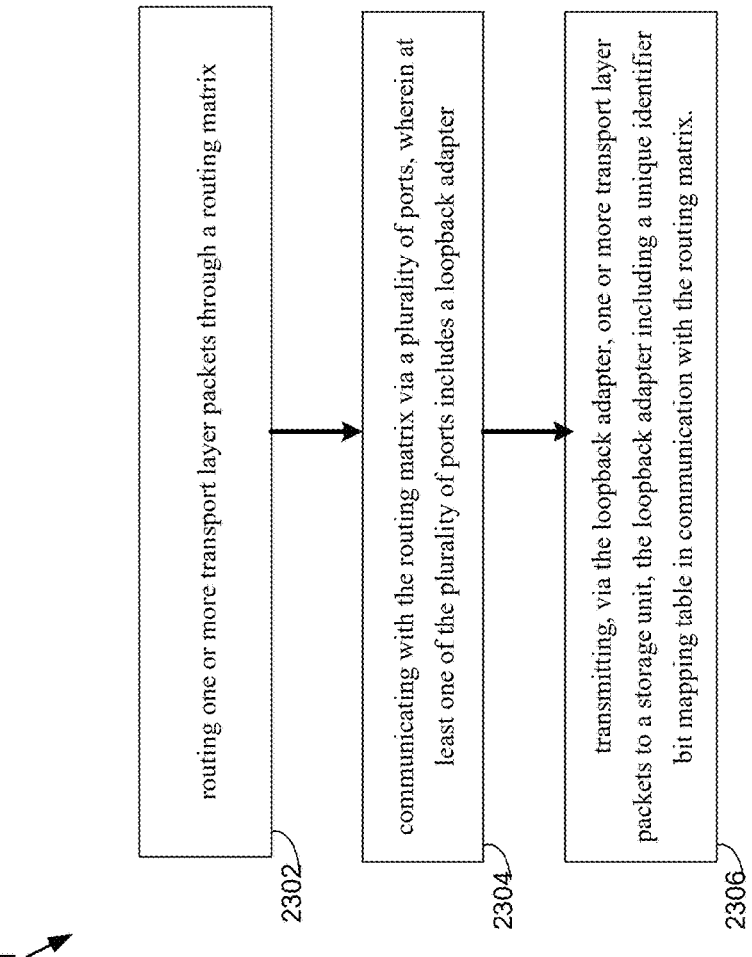

routing one or more transport layer packets through a routing matrix

2302 communicating with the routing matrix via a plurality of ports, wherein at least one of the plurality of ports includes a loopback adapter

2304 transmitting, via the loopback adapter, one or more transport layer packets to a storage unit, the loopback adapter including a unique identifier bit mapping table in communication with the routing matrix.

SYSTEM AND METHOD FOR ROUTING IN AN ELECTRONIC DESIGN USING A LOOPBACK ADAPTER

FIELD OF THE INVENTION

The present disclosure relates to a method of electronic circuit design, and more particularly, to a high availability routing matrix architecture and protocol.

BACKGROUND

As integrated circuit design grows more complicated, it is necessary to verify and validate designs with many components talking to each other. This means that the hardware and software verification tools need to connect multiple design entities talking simultaneously using a common exchange unit (transaction). At present in most solutions which require routing, the data is transferred to software, or to an embedded central processing unit ("CPU"), where the routing is done. This works sufficiently when the design throughput is low, or when the embedded CPU can run at a much higher clock frequency, to bridge over the speed differential.

SUMMARY

In one or more embodiments of the present disclosure, a system for routing one or more packets is provided. The system may include a routing matrix configured to route one or more transport layer packets. The system may include a plurality of ports configured to communicate with the routing matrix. At least one of the plurality of ports may include a loopback adapter configured to store and re-transmit one or more transport layer packets received. The loopback adapter may include a unique identifier mapping table in communication with the routing matrix.

One or more of the following features may be included. In some embodiments, the loopback adapter may be configured to receive a transaction from the transport layer on a first unique identifier and to transmit it back to the transport layer on a second unique identifier. The plurality of ports may include a plurality of loopback adapters. The loopback adapter may be configured to store a plurality of incoming transaction packets identified by unique identifier in single/multiple buffers. The routing table may include an input unique identifier, an output unique identifier, and an output port identifier. The loopback adapter may be implemented at a register transfer level. The plurality of ports may include one or more universal serial bus ("USB3" or "USB4") ports, DisplayPort ("DP") or peripheral component interconnect express ("PCIe") ports. The loopback adapter may be configured to perform a header error checksum ("HEC") update. The output unique identifier may be transmitted along a different path from the input unique identifier. The loopback adapter may be configured to duplicate, re-route, alter, or terminate the one or more transport layer packets (TLP) packets.

In one or more embodiments of the present disclosure a method for routing one or more packets is provided. The method may include routing one or more transport layer packets through a routing matrix and communicating with the routing matrix via a plurality of ports, wherein at least one of the plurality of ports includes a loopback adapter. The method may further include transmitting, via the loopback adapter, one or more transport layer packets to a storage unit, the loopback adapter including a unique identifier mapping table in communication with the routing matrix.

One or more of the following features may be included. In some embodiments, the method may include receiving, at the loopback adapter, a transaction from the transport layer on a first unique identifier and to transmit it back to the transport layer on a second unique identifier. The plurality of ports may include a plurality of loopback adapters. The method may further include storing, at the loopback adapter, a plurality of incoming unique identifiers in a buffer. The routing table may include an input unique identifier, an output unique identifier, and an output port identifier. The loopback adapter may be implemented at a register transfer level. The plurality of ports may include one or more universal serial bus ("USB") ports or peripheral component interconnect express ("PCIe") ports. The method may also include performing, at the loopback adapter, a header error checksum ("HEC") update. The output unique identifier may be transmitted along a different path from the input unique identifier. The loopback adapter may be configured to duplicate, re-route, alter, or terminate the one or more TLP packets.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 2 is an exemplary flowchart of a routing process according to an embodiment of the present disclosure;

FIG. 23 is an exemplary flowchart of a loopback adapter process according to an embodiment of the present disclosure.

DETAILED DESCRIPTION

Figure 1:
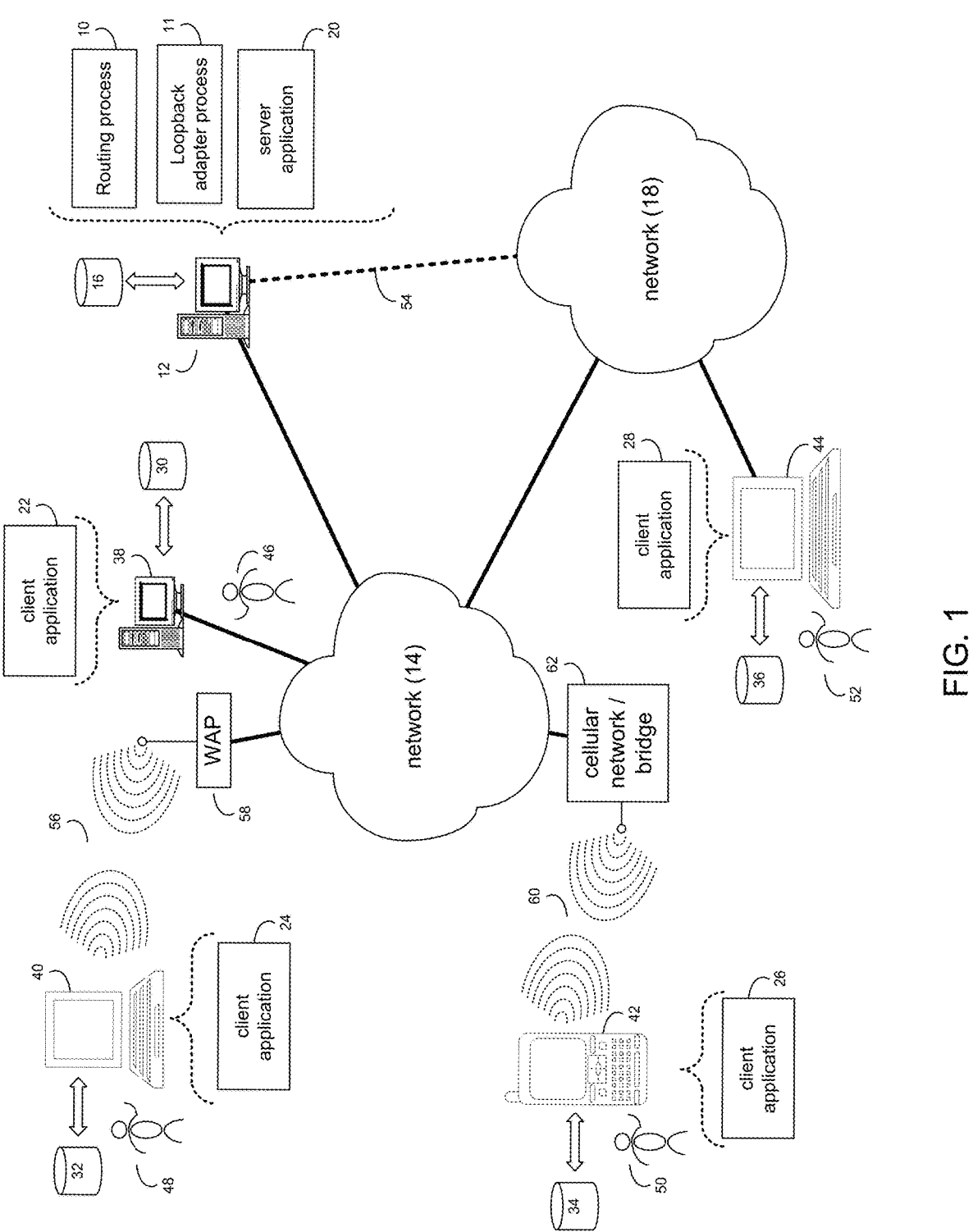
FIG. 1 diagrammatically depicts a routing process coupled to a distributed computing network.

As discussed above, hardware and software verification tools may need to connect multiple design entities talking simultaneously using a common exchange unit (transaction). Accordingly, embodiments of the present disclosure are directed towards a routing process that defines the common architecture for the routing logic which transfers the transactions between a sender (initiator/ingress) and a receiver (target/egress). Embodiments included herein describe the protocol of transaction exchange and its improvement upon existing technologies and ensure that both the initiator and target are free to perform other tasks while they are waiting for the other end. In this way, multiple entities may communicate with each other simultaneously and with minimal latency between transfers.

As Design Under Tests ("DUT"'s) become more and more complicated, the verification scenarios warrant more complex verification components. A verification component may include a hardware and/or software entity which is not part of the design, but is a component used to test and verify functionality the design features and functionality. Occasionally, a single verification component is not enough and the design requires many of these verification components to communicate with each other, which requires internal routing between multiple instances. Accordingly, embodiments of the routing process included herein define an architecture and a protocol to implement a routing matrix to allow multiple verification components to communicate with each other with very high throughput. The proposed routing matrix utilizes multiple de-centralized memories to make the design easier to partition and has very high availability. For example if there exists a path from entity A to B, and there is another from entity C to D, then they operate completely independently and unhindered, thus no arbitration may be required. If there are multiple paths amongst entities P to Q and P to R then the bandwidth is shared, but the connection is never blocked and the paths may still operate independently, activating for transfer only when there is an available packet to be sent over. The priority and arbitration logic are completely configurable and the proposed protocol allows for architectures allowing both the sending and receiving entities to prioritize as is discussed in further detail hereinbelow.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings may denote like elements.

Referring to FIG. 1, there is shown a routing process 10 and a loopback adapter process 11 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™, or Redhat Linux™, for example. Additionally and/or alternatively, routing process 10 and/or loopback adapter process 11 may reside on a client electronic device, such as a personal computer, notebook computer, personal digital assistant, or the like.

The instruction sets and subroutines of routing process 10 and/or loopback adapter process 11, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS™, Novell Webserver™, or Apache Webserver™, that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute routing process 10 and/or loopback adapter process 11. Examples of client applications 22, 24, 26, 28 may include, but are not limited to, design verification tools such as those available from the assignee of the present disclosure. These applications may also be executed by server computer 12. In some embodiments, routing process 10 and/or loopback adapter process 11 may be a stand-alone application that interfaces with server application 20 or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the routing process may be a client-side application (not shown) residing on one or more client electronic devices 38, 40, 42, 44 (e.g., stored on storage devices 30, 32, 34, 36, respectively). As such, the routing process may be a stand-alone application that interfaces with a client application (e.g., client applications 22, 24, 26, 28), or may be an applet/application that is executed within a client application. As such, the routing process may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features verify a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, routing process 10 and/or loop-back adapter process 11 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows™, Microsoft Windows CE™, Redhat Linux™, Apple IOS, ANDROID, or a custom operating system.

Figure 2:
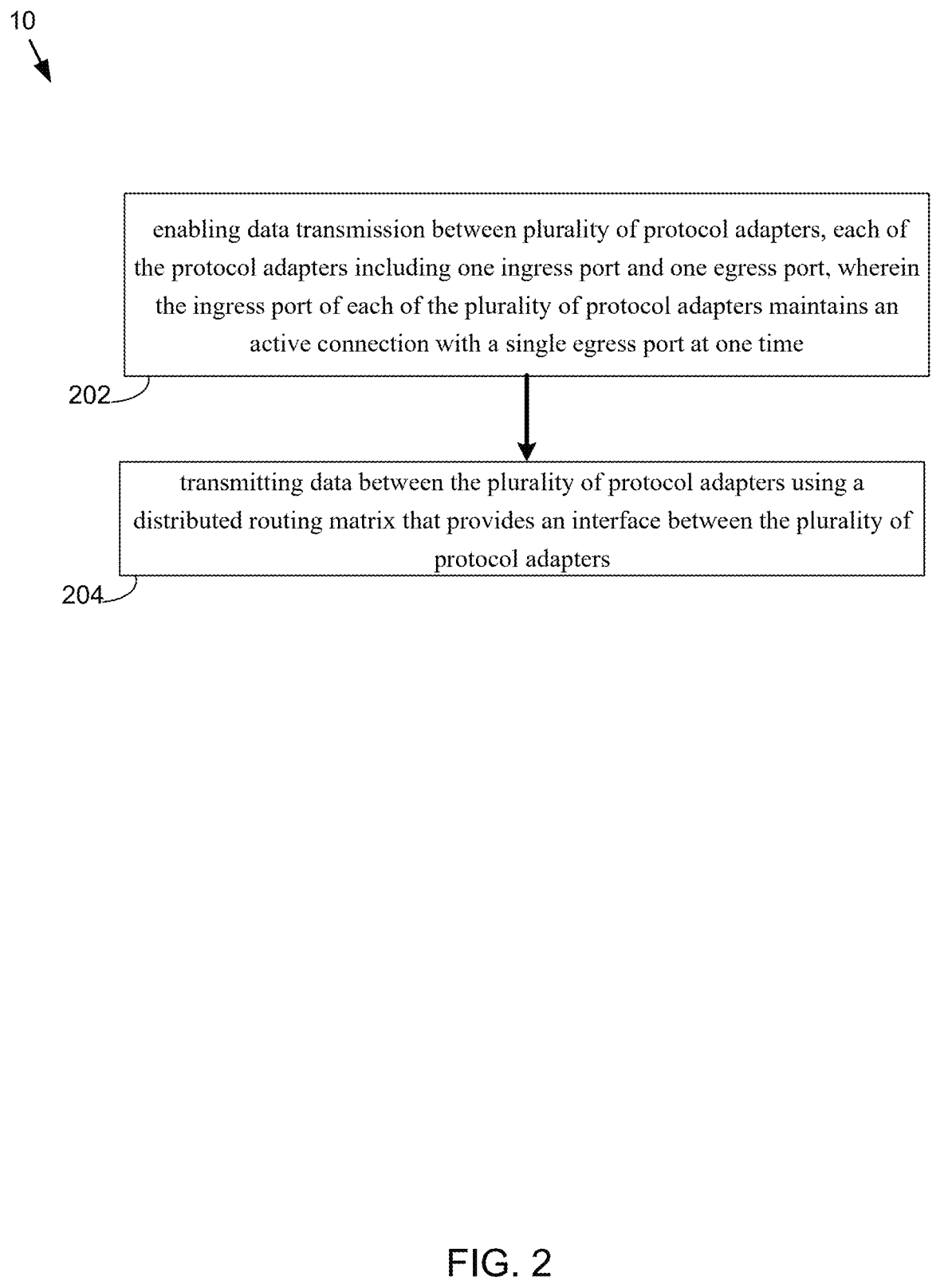

Referring now to FIG. 2, a flowchart depicting an embodiment consistent with routing process 10 is provided. Embodiments may include enabling 202 data transmission between plurality of protocol adapters, each of the protocol adapters including one ingress port and one egress port, wherein the ingress port of each of the plurality of protocol adapters maintains an active connection with a single egress port at one time. Embodiments may further include transmitting 204 data between the plurality of protocol adapters using a distributed routing matrix that provides an interface between the plurality of protocol adapters. Numerous other operations are also within the scope of the present disclosure.

Figure 3:
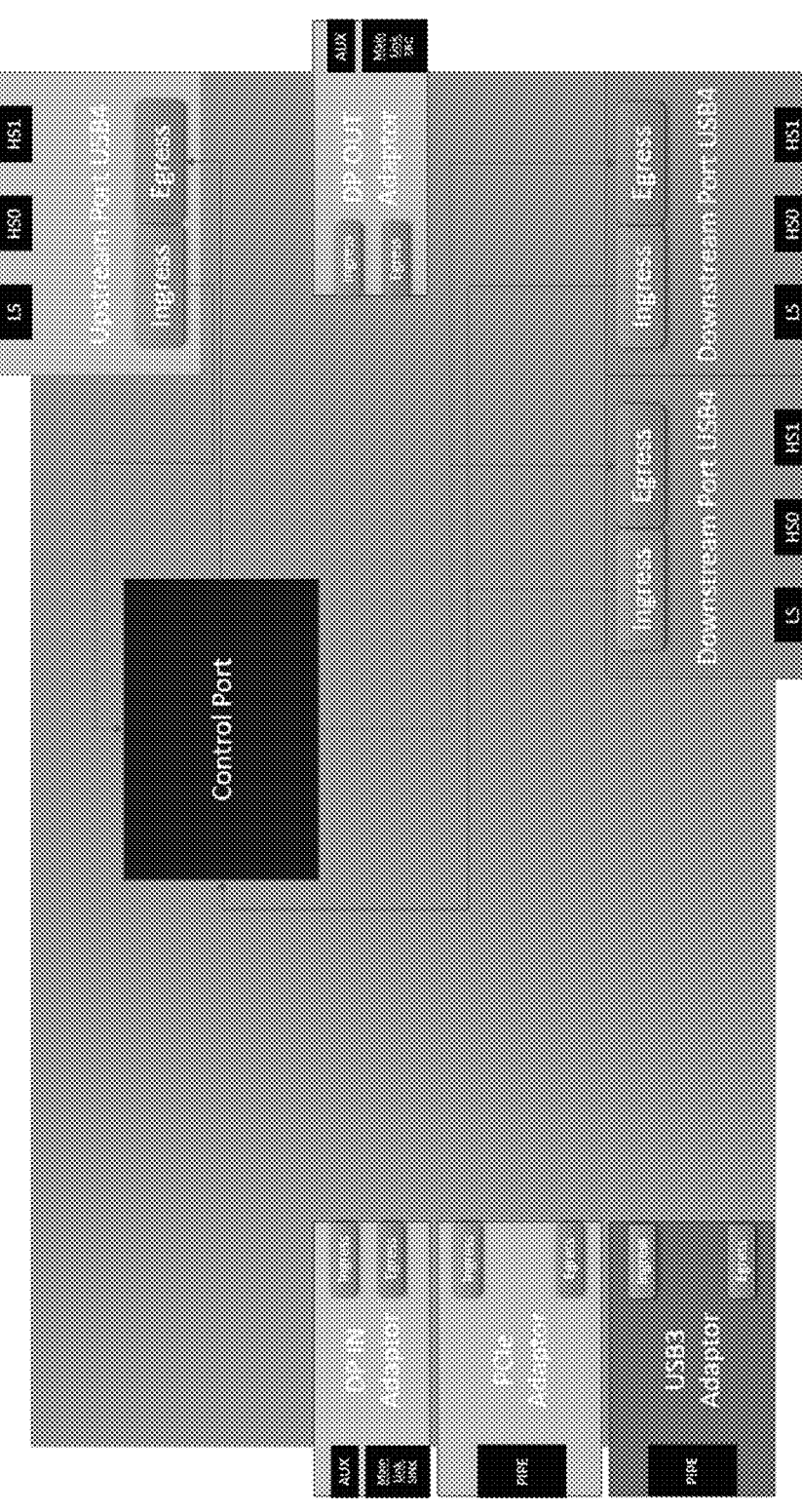
FIG. 3 is an example USB4 router architecture according to an embodiment of the present disclosure.

Referring now to FIG. 3, a diagram 300 showing an example USB4 router architecture is provided. While examples included herein discuss USB4 it should be noted that this is provided merely by way of example as embodiments of routing process 10 may be used in a variety of different applications. Modern communication interfaces like USB4 are more than a collection of simple one-to-one connections. These devices act more like network routers. When a customer wishes to test their own USB4 host or device on an emulation platform (such as those available from the Assignee of the present disclosure), they would need the corresponding pair device or host component to push traffic on to their DUT. Some verification components may be employed with the primary goal of pushing as much data as allowed on to the DUT running on the emulation platforms from the software side, and simultaneously grabbing as much data as possible from the DUT and providing the user with an application programming interface ("API") to drive/receive this traffic on the simulator side.

The DUT running on emulation platforms, typically would operate on the fastest design clock frequency it was compiled to, but with these verification components trying to interact with the software layers, the design clock has to stop to allow the software to catch up with the emulation platforms. The less frequent these interruptions happen, the faster the DUT can operate leading to lower verification turnaround.

Specifically, for USB4, the protocol may tunnel various other protocols some of which may include, but are not limited to, DisplayPort, PCIe, and USB3, over the USB4 fabric. A single USB4 device may have multiple instances of these tunneled protocol instances (called adapters/ports) connected to one USB4 adapter port. In some cases, there may be more than one USB4 Adapter in a device, for a hub like configuration, with one adapter acting as an upstream port, and the other downstream. The main controller of this hierarchy is referred to as a configuration manager (CM), which is at the top of the hierarchy operating inside a USB4 host.

To help achieve this, the USB4 protocol may include a transport layer, in which all the adapters may talk to each other via TLPs, and there may be up to 64 adapters in one device. Every adapter may include two entities, one referred to herein as an "ingress", which may buffer in all the TLPs coming in the transport layer, and another referred to herein as an "egress" which prioritizes all the packets going out of the transport layer. The USB4 protocol may also define the way routes/logical connection between adapters may be established from the CM by programming register sets within a routing table but is silent on the actual mechanism of the TLP exchange between the adapters, and how the adapters actual transfer packets among each other.

Accordingly, embodiments of routing process 10 provide an architecture and protocol to exchange the TLPs. This approach outlines the specific constraints being used within an emulation platform, the maximum protocol throughput allowed for the DUT, and allows for many verification scenarios to mimic and validate real life designs.

Figure 4:
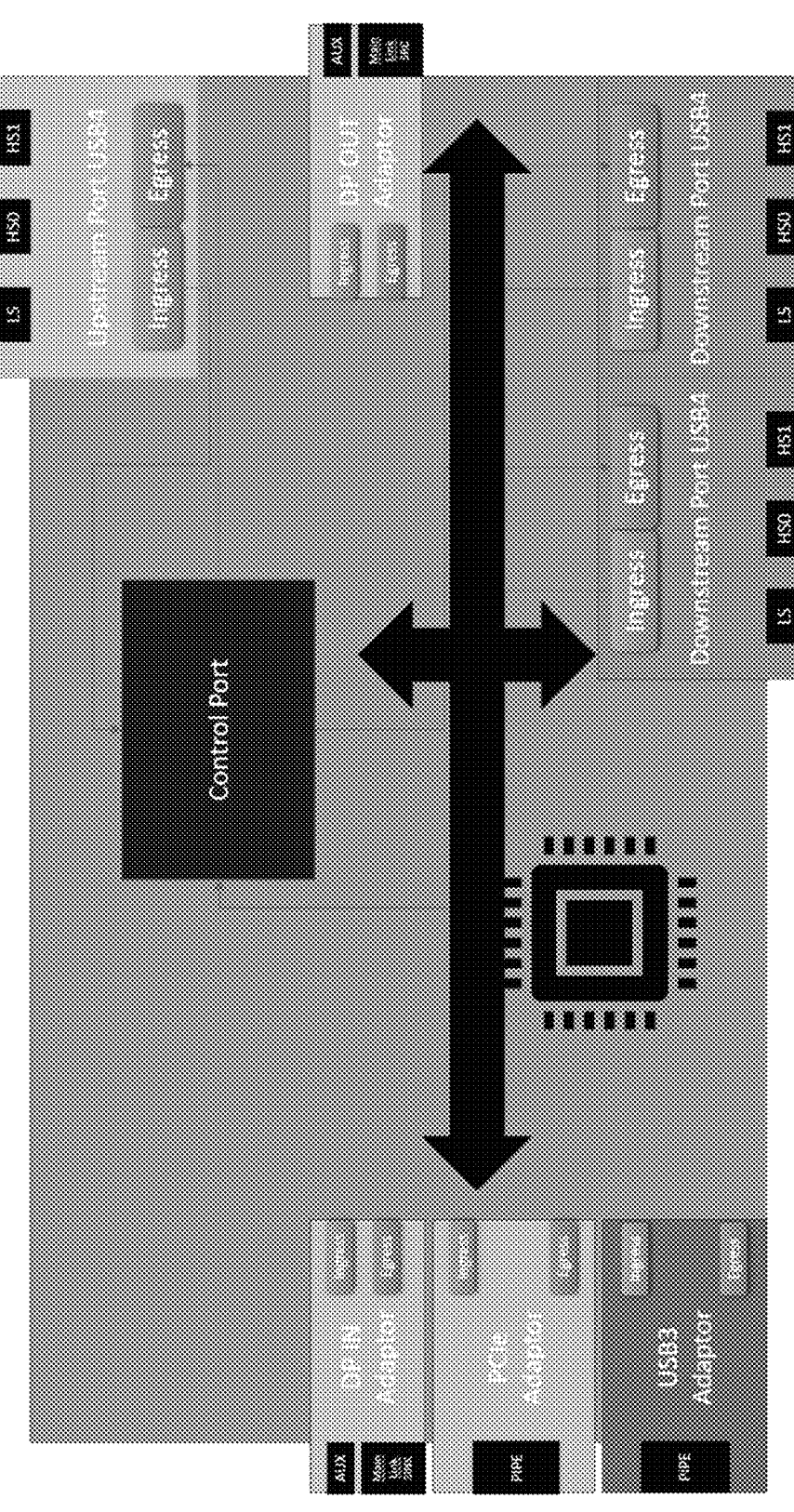
FIG. 4 is an example showing a diagram with a dedicated central processing unit ("CPU") according to an embodiment of the present disclosure.

Using existing approaches, the routing logic is typically implemented in an emulation setting using some of the approaches discussed below. As shown in FIG. 4, one approach includes using a dedicated CPU, which generally involves employing a dedicated CPU running at a very high frequency design clock. This approach has the advantage of being 100% RTL, so no hardware/software exchanges need to happen, the CPU may be programmed using firmware to adjust to different user scenarios, and the byte code may be loaded into the memory after compilation. However, this scenario is disadvantageous in terms of the actual gate area, and the CPU design clock needed would be more than the fastest USB4 clock frequency. This would slow down the entire verification environment, leading to a significantly overall lower throughput. Also, a single CPU would struggle to keep up with 64 requests coming in from all of the active ports simultaneously, which would require more than one CPU, further multiplying the disadvantages.

Figure 5:
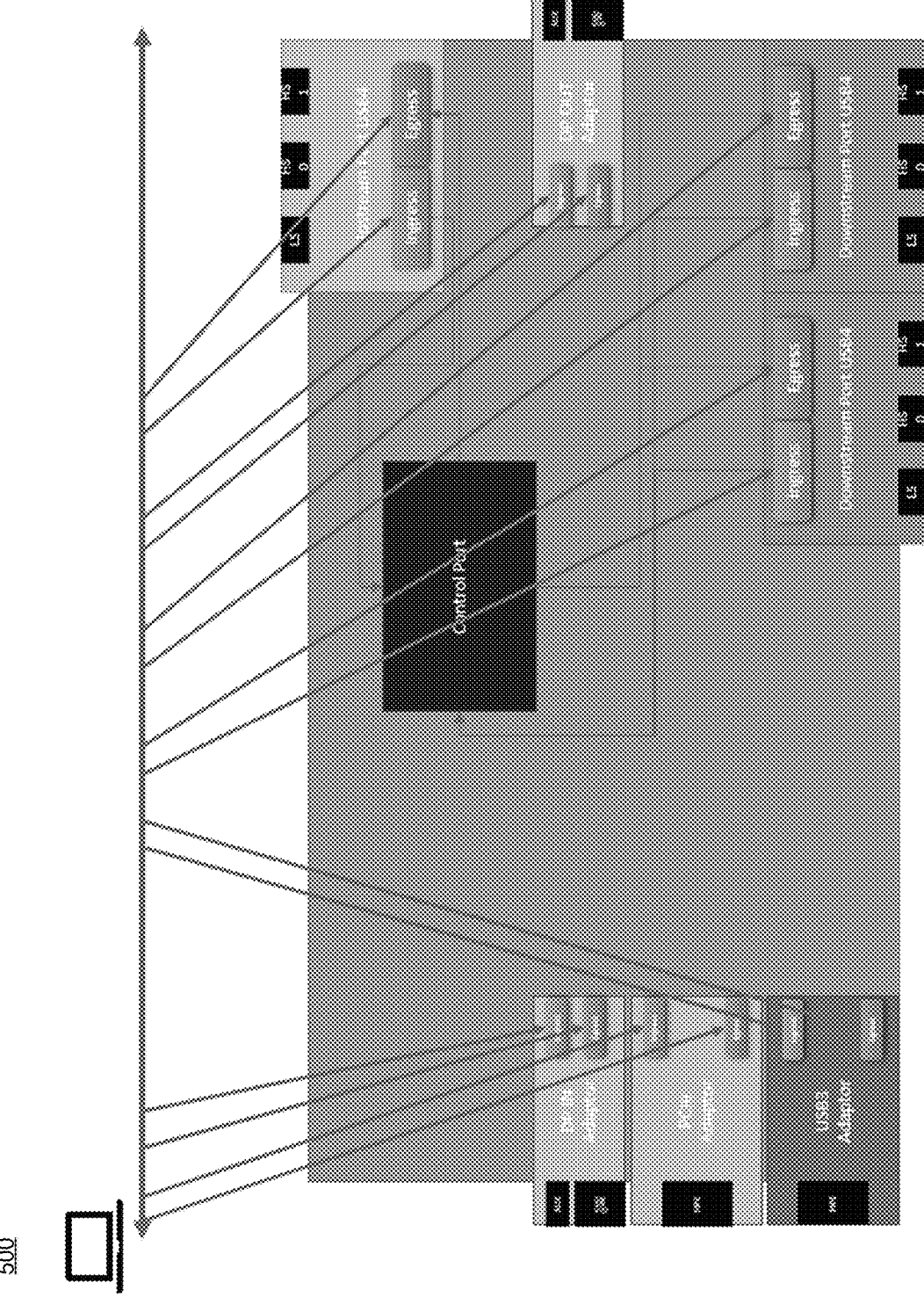
FIG. 5 is an example showing routing within a simulation acceleration environment according to an embodiment of the present disclosure.

Referring now to FIG. 5, an embodiment showing a diagram 500 depicting another approach that involves delegating the routing logic to the software layer is provided. Since we are talking in terms of hardware/software co-design, there is a possibility to pass all the TLPs to the software layer running on the host parallel to the DUT and verification components running on the emulator. This approach has the advantage of being least costly in terms of gate area, and there is no need to use a faster clock than the USB4 design clock. However, every time the hardware/software buffers are empty, the hardware will have to stop and wait for the software to catch up. This may have an impact on the overall design throughput. Also, since there are multiple verification components for DisplayPort, PCIe and USB3 protocols, with their respective software layers running in parallel, the host connected to the emulator would get loaded very quickly making this a solution that is difficult to scale.

Figure 6:
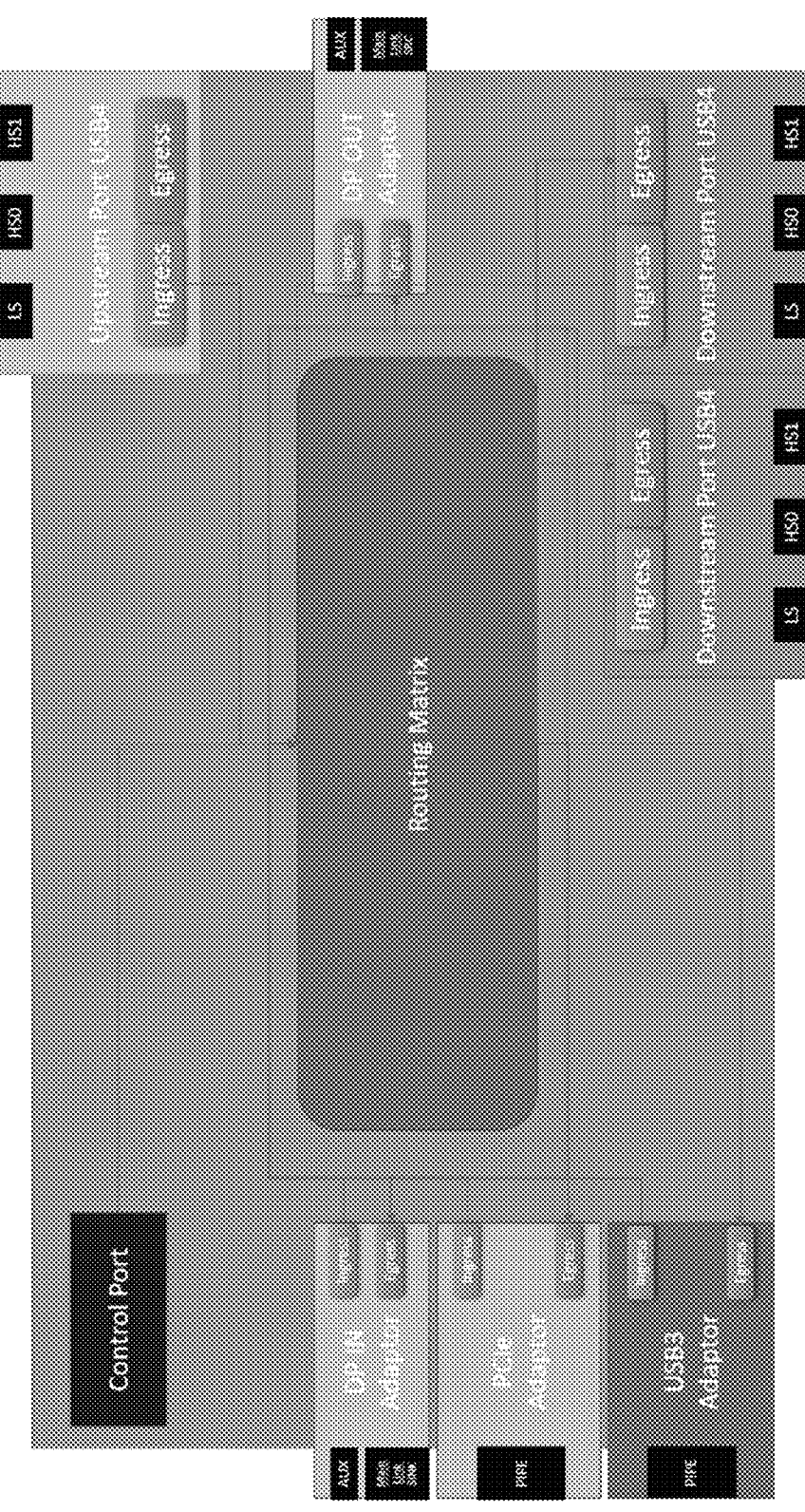
FIG. 6 is an example showing a register transfer level ("RTL") solution according to an embodiment of the present disclosure.

Referring now to FIG. 6, and in contrast to the approaches described above, embodiments of routing process 10 include a 100% RTL implementation 600, including a custom protocol for TLP exchange. Since the complete protocol is RTL-based, there are no hardware/software exchanges required to properly route the packets, and the protocol may operate at the fastest USB4 clock frequency thus mitigating clock related slowdown. This implementation is completely non-blocking in nature, and may be distributed amongst the various adapters, so there is no single controlling logic. All adapters may be treated at par, and this architecture allows for simultaneous transfers between all the adapters. This protocol is more scalable and should allow for far more than 64 entities to communicate. Also, the egress and ingress adapters are unblocked to attempt sending/receiving TLPs with other adapters if the adapter they are trying to transact with are busy. Also, this approach is better from compilation perspective, and leads to a lower step count (critical path).

In some embodiments, routing process 10 may include a routing architecture and associated protocol as are discussed in further detail below. For the transport layer, the design may be split up into two major parts. The first is the individual protocol adapters, with one ingress and one egress each. The second part is a single module referred to herein as the "routing matrix", which may be configured to interface with all the adapters.

In some embodiments, the architecture may be configured such that the ingress ports may receive the TLPs from the various adapters and store them in local buffers (as per the USB4 protocol in this example). The logical connections, referred to herein as "paths", may be configured by the CM, and these values may be saved in the routing table. The routing table may include one bit to indicate that the path is active and one unique identifier referred to herein as "HopID". The routing table may include one or more static parameters for a path such as the output adapter number which once set may remain fixed for the complete duration of the path's existence. The routing table may include one or more dynamic parameters that may change on the basis of the present workload. Since there may be a finite number of unique identifiers, the HopIDs may be reused between different paths. To enable this the unique identifier HopID may be changed by the ingress port and this value may be stored within the routing table. In some embodiments, the routing table may be stored within the ingress, and this may include one or more of the following parameters:

1. Valid: One-bit value to indicate if the path is valid.
2. HopID: This is a logical name for the Path.
3. Output HopID: The Output HopID for the outgoing packet.
4. Output Adapter Number: This value is the destination adapter number, to which the TLPs on this path are supposed to be sent to.
5. Priority: This value is the priority of the path. This value can help decide the path priority at the egress port of the destination egress port.
6. Weight: This value helps avoid a high priority path hogging all bandwidth. The Egress can only schedule TLPs equal to the weight count in one round, after that paths with lower priority are selected.

In this example, the HopID is the unique identifier, output adapter number and priority are static parameters while weight is a dynamic parameter which may be changed even after the path has been activated.

In some embodiments, the actual routing protocol may be split up into multiple distinct phases. Some of these may include, but are not limited to, Request, RequestAck, Pkt-TransferRequest, and PktTransfer. Each of these is discussed in further detail hereinbelow.

In some embodiments, the routing matrix and the ingress ports may be connected using the following prominent RTL signals for the Request and RequestAck phases (the same signals may also connect the routing matrix and egress port, but all directions are reversed):

TABLE 1

| List of Signals for Request Phase | | | |
|---|---|---|---|
| Signal Name | Direction I (Egress -> Routing-Matrix; Routing-Matrix -> Ingress) O (Routing-Matrix -> Egress; Ingress -> Routing-Matrix) | Type | Description |
| r.Request | I | Enum | Request Type from Ingress to Egress |
| r.HopID | I | Unsigned | Unique Identifier |

TABLE 1-continued

List of Signals for Request Phase

| Signal Name | Direction<br>I (Egress -><br>Routing-Matrix;<br>Routing-Matrix -><br>Ingress)<br>O (Routing-<br>Matrix -> Egress;<br>Ingress -><br>Routing-Matrix) | Type | Description |
|---|---|---|---|
| | | | for the Path |
| r.Count | I | Unsigned | Number of Packets<br>for the Request |
| r. OutputPort | I | Unsigned | Destination Port |
| r. InputPort | I | Unsigned | Originating Port |
| r.Parameters<br>[Priority,<br>Weight] | I | Unsigned | Path Parameters |
| r.Ack | O | Bool | Acknowledgement |
| r.Nack | O | Bool | Not-Acknowledge |

The Request Enum may include multiple values, for example for USB4, we use PathSetupRequest, Path.

For the PktTransferReq and PktTransfer phase, an example of a signal list is provided below:

TABLE 2

List of Signals for Packet Transfer Phase

| Signal Name | Direction<br>I (Egress -><br>Routing- Matrix;<br>Routing-Matrix -><br>Ingress)<br>O (Routing-<br>Matrix -> Egress;<br>Ingress -><br>Routing-Matrix) | Type | Description |
|---|---|---|---|
| p.Request | I | Enum | Request Type from<br>Ingress to Egress |
| p.HopID | I | Unsigned | Unique Identifier<br>for the Path |
| p.OutputPort | I | Unsigned | Destination Port |
| p.InputPort | I | Unsigned | Originating Port |
| p.Packet | O | Packet<br>Structure | The Actual<br>Transaction |
| p.Packet<br>Valid | O | Bool | If the Packet is<br>Valid |
| p.Ack | I | Bool | Acknowledgement<br>from Egress |
| p.Nack | I | Bool | Not-<br>Acknowledgement<br>from Egress |
| p.Done | O | Bool | Terminating signal<br>from Ingress |

Figure 7:
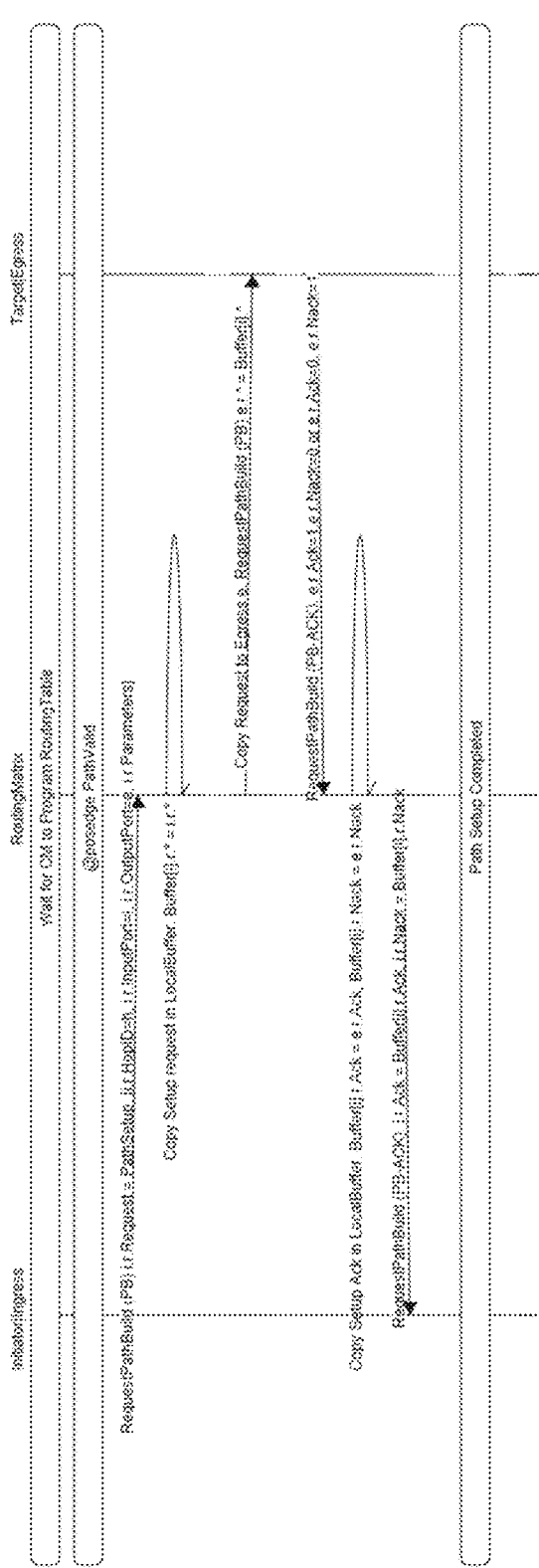
FIG. 7 is an example showing a path setup sequence chart according to an embodiment of the present disclosure.
Figure 8:
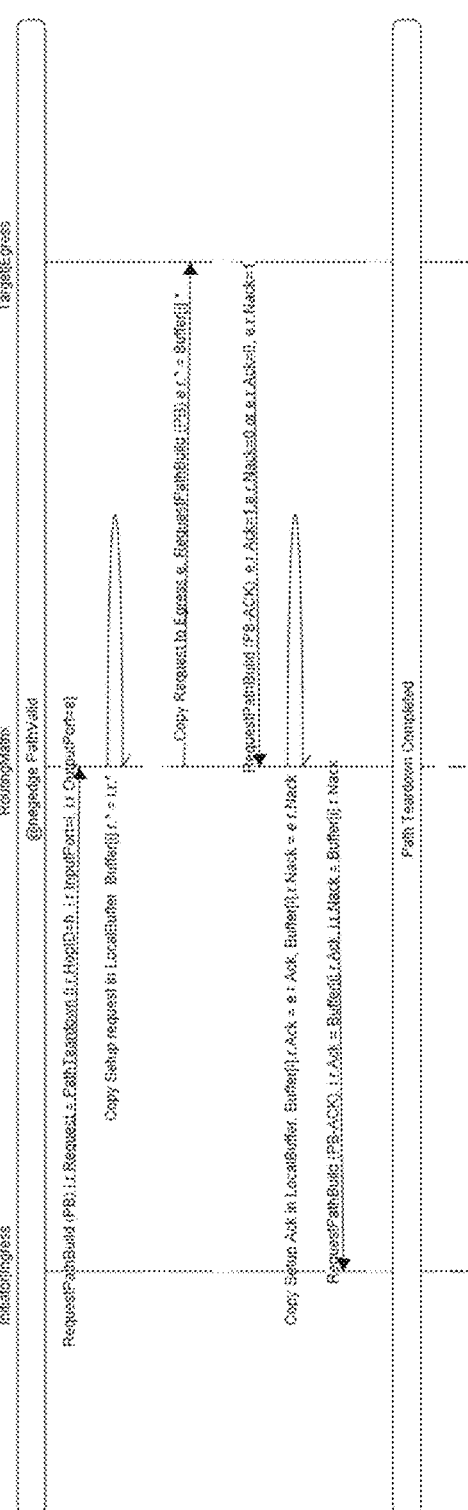
FIG. 8 is an example showing a path teardown sequence chart according to an embodiment of the present disclosure.

In some embodiments, and referring also to FIGS. 7-8, routing process 10 may include a path setup and a path teardown protocol each of which is discussed in further detail hereinbelow. Path setup and teardown processes may only employ the Request and RequestAck phases. Both may follow the same process as listed below.

In the Request phase, the ingress port may monitor the routing table, and any HopID going from Valid=0 to Valid=1, triggers a path setup request, while a transition from Valid=1 to Valid=0 triggers a PathTearDown request. There may be multiple path setup/teardown requests active at one point of time, the ingress adapter monitors all open requests, and analyzes them one by one.

In some embodiments, for every request, the routing matrix may be informed of the request by changing the i.r.Request from NOP [No Operation] to [PathSetup or Path TearDown] as applicable, with i.r.HopID, i.r.InputPort, i.r.OutputPort, set to valid values. For a Path Teardown request, i.r.Parameters may be unset, but it requires valid values for a PathSetup request.

In some embodiments, the routing matrix may analyze all the active ports, and check the values of the request phase signals facing the ingress ports. For any port, if there is no pending request, the values may be stored in the internal buffers. The ingress adapter may continue to wait until i.r.Ack is set.

In some embodiments, the routing matrix also goes through all its internal buffers and evaluates if there are any pending requests. For all pending requests, it checks if there are no requests destined to the same egress port, if so, it performs an internal priority resolution, and selects the one with more priority, or least port number. Then, it may pass on the value of the i.r.Request, i.r.HopID, i.r.InputPort, i.r.OutputPort and i.r.Parameters to the destined egress port.

In some embodiments, routing process 10 may also include a request acknowledgement phase [RequestAck]. Here, all egress ports may evaluate the requests they receive from the routing matrix and revert back with e.r.Ack=1 or e.r.Nack=1, or they continue to hold on to the request for a pre-defined timer value. If this is saved in the internal buffers of the routing matrix, and at the next clock edge, this response (e.r.Ack and e.r.Nack) may be sent back to the waiting ingress adapter. If the routing matrix does not see any response after the specified timer elapses, the request may be cancelled, all the signals r.* facing the egress ports may be set to 0, and the e.r.Nack=1 may be sent to the ingress port, which then either reattempts the same request again, or attempts a different request.

Figure 9:
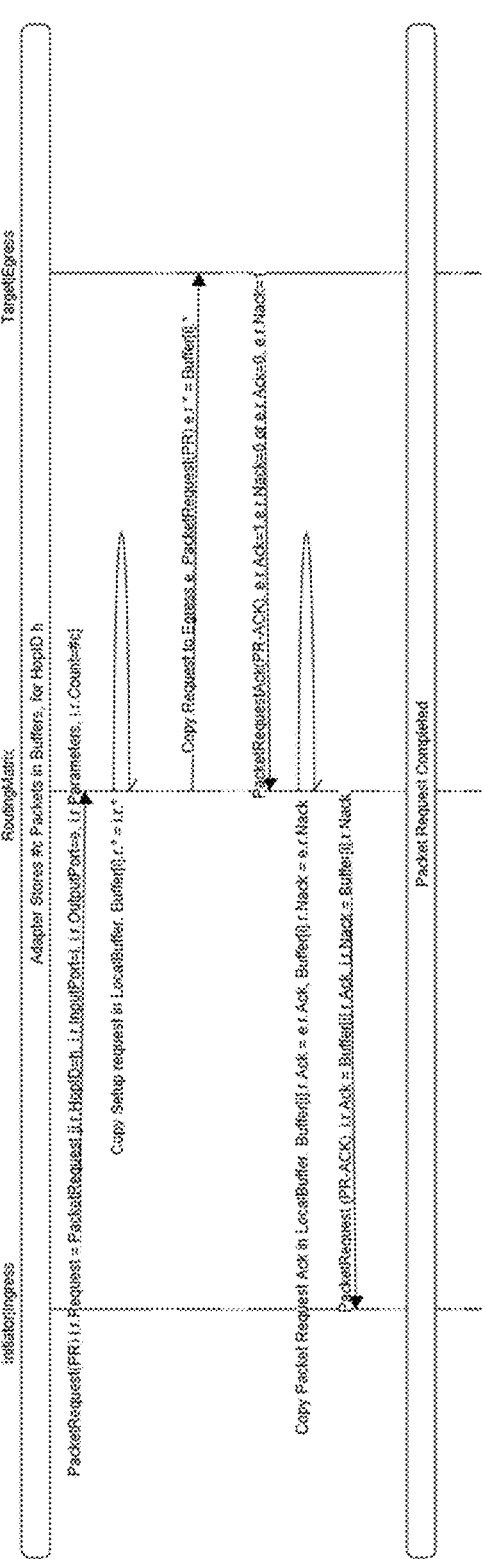
FIG. 9 is an example showing a packet transfer request sequence chart according to an embodiment of the present disclosure.

In some embodiments, and referring also to FIG. 9, routing process 10 may include a protocol for TLP exchange. The protocol to exchange TLPs between different instances may include a multi-part approach. The first part may include a packet request phase (e.g., Packet Request [Request] shown in FIG. 9). Here, the TLPs may be stored in the ingress port "i" against multiple HopIDs. When the ingress adapter is free, the buffers may be scanned and on all the paths which have active packets in wait. The ingress adapter may internally prioritize the open paths, for example, for most adapters the paths to the USB4 adapter should have a higher priority. This request may then be scheduled on to the routing matrix. i.r.Request may be changed to PacketRequest, i.r.HopID=h, i.r. InputPort=i, i.r.OutputPort=e, i.r.Count=C are set to valid values, and the i.r. Parameters are set to dynamic parameter values pulled out from the routing table. The routing matrix may then analyze all the active ports, checking if the particular adapter has an active request. If not, the routing matrix may copy over the values in the local buffer.

In some embodiments, the protocol for TLP exchange may include a packet request acknowledgement [Request-Ack] phase. Here, the routing matrix may analyze all the pending requests for egress adapters and once it identifies a pending request in the local buffer, it copies these values over to the destined egress adapter. The egress adapter may acknowledge the request with e.r.Ack=1, or discard if it is either not ready, or there is no valid path by setting e.r.Nack=1. These values may be stored in the local buffers present in the routing matrix. Then, the routing matrix may push back the result of the request from its local buffer back to the ingress adapter. The ingress adapter may read the values of the i.r. Ack and i.r. Nack. If the request is acknowledged, then the ingress adapter waits for a request from the egress adapter, otherwise it is free to request again or inform the higher layers of the failure.

In some embodiments, the protocol for TLP exchange may include packet transfer request [PktTransferRequest] phase. Here, the egress adapter is aware of the number of packets pending, the HopIDs, the static and dynamic path parameters, and the egress adapter can freely prioritize the paths. The egress adapter may select one ingress adapter and the HopID from the list of all open resources after following the prioritization logic, for example, for USB4 it may perform a round robin on the priority logic but may schedule only up to weight count packets per path. The egress adapter set values for e.p.Request, e.p.HopID, e.p.InputPort, e.p.OutputPort and passes this on to the routing matrix. The routing matrix copies these over to its internal buffer (this buffer may differ from the one maintained for the requests). On the next clock these values may be copied over to the destined ingress adapter, from which the egress adapter seeks the packets by setting i.p.Request, i.p.HopID, i.p.InputPort and i.p.OutputPort.

Figure 10:
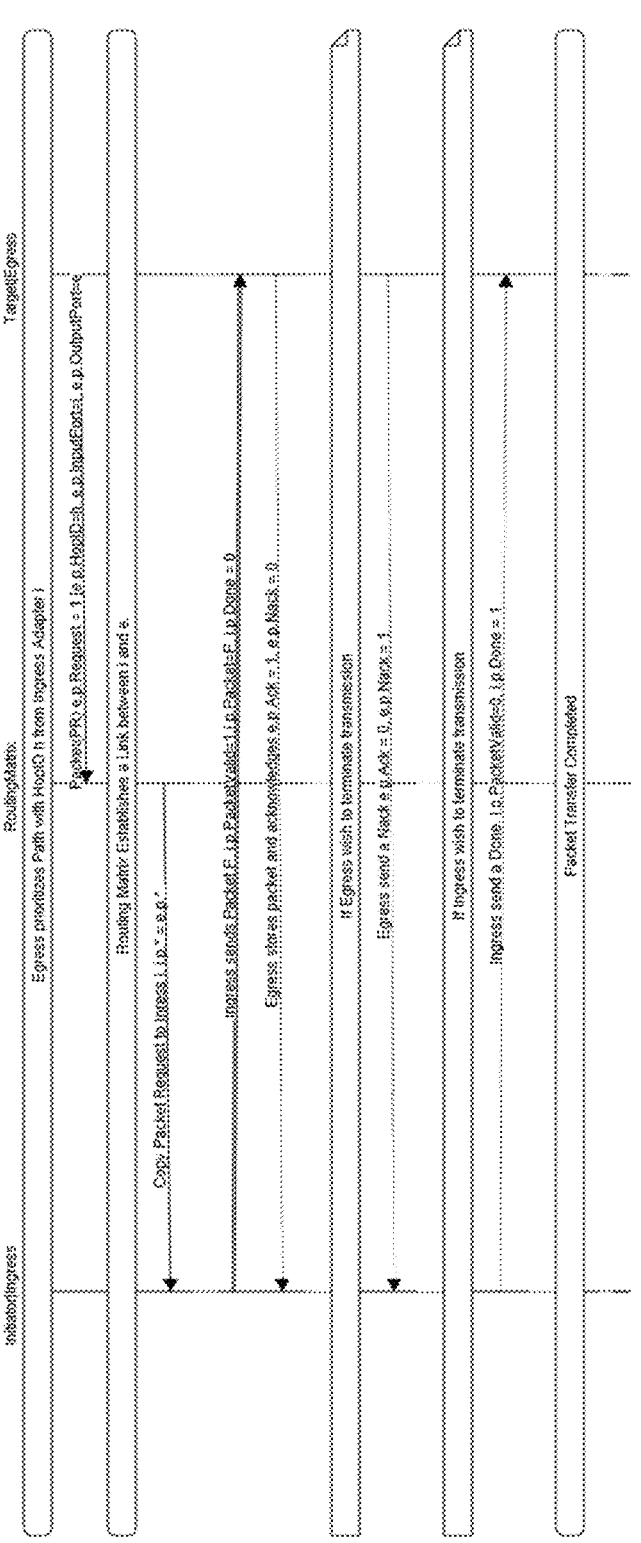
FIG. 10 is an example showing a packet transmission sequence chart according to an embodiment of the present disclosure.

In some embodiments, the protocol for TLP exchange may include a packet transfer [PktTransfer] phase as shown in FIG. 10. Here, the ingress port identifies the request coming in from the routing matrix and at the next clock edge it may start populating the i.p.Packet and i.p.Packet Valid signals fetching these from its internal buffers. While the link is active, the routing matrix may maintain a connection between the egress and the ingress adapters and may transfer the packets from ingress to egress without any intermediate buffering. This implies that the signals may pass from ingress to egress without any delay, and vice versa. Every time a packet is transferred, the egress will assert e.p.Ack signal, which may be connected to the i.p.Ack signal, and e.p.Nack in the event it is unable to sink in anymore packets. The ingress may retain the values of the i.p.Packet and i.p.PacketValid until it sees either i.p.Ack or i.p.Nack signal. The transmission may be completed, when e.p.Nack is asserted. In the event the egress wants to stretch out the request, it may continue to hold e.p.Ack and e.p.Nack to low. In the event that the ingress receives a high priority request or it wish to break off the connection for any reason, or if there are no more pending packets available, it may assert the i.p.Done signal. Similarly, the transmission may be terminated, if e.p.Nack is asserted. While the transmission is in progress, the routing matrix may continue to maintain a one to one connection, with no delay, and it may continue to monitor the i.p.Done and e.p.Nack signals. When either of these is asserted, the link is broken. The link may also be broken off if the e.p.Request is de-asserted, however this is unusual. The ingress will not know if the packet which was in flight was completed or not, and it may reattempt the same again.

Figure 11:
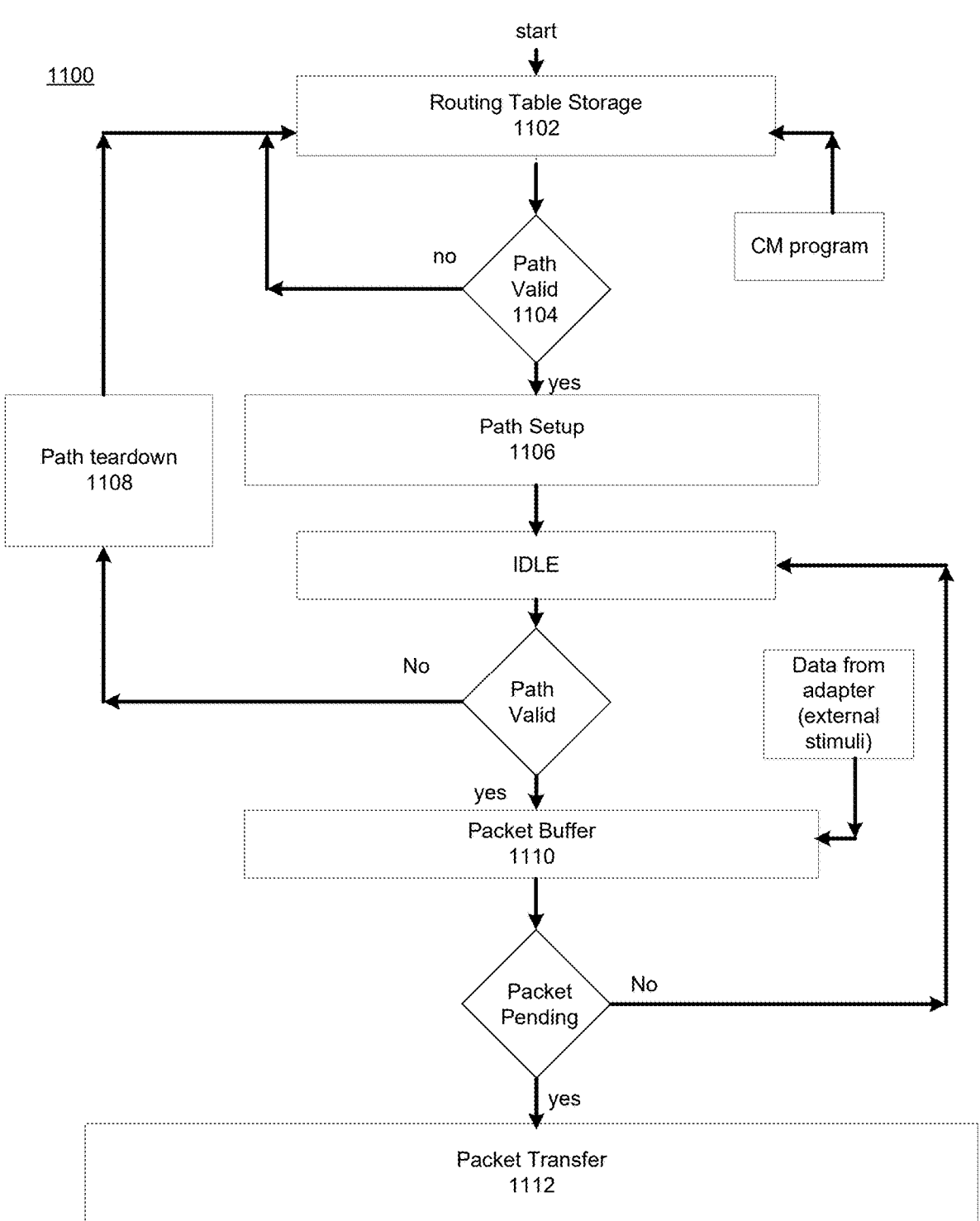
FIG. 11 is an exemplary flowchart of a routing process according to an embodiment of the present disclosure.
Figure 12:
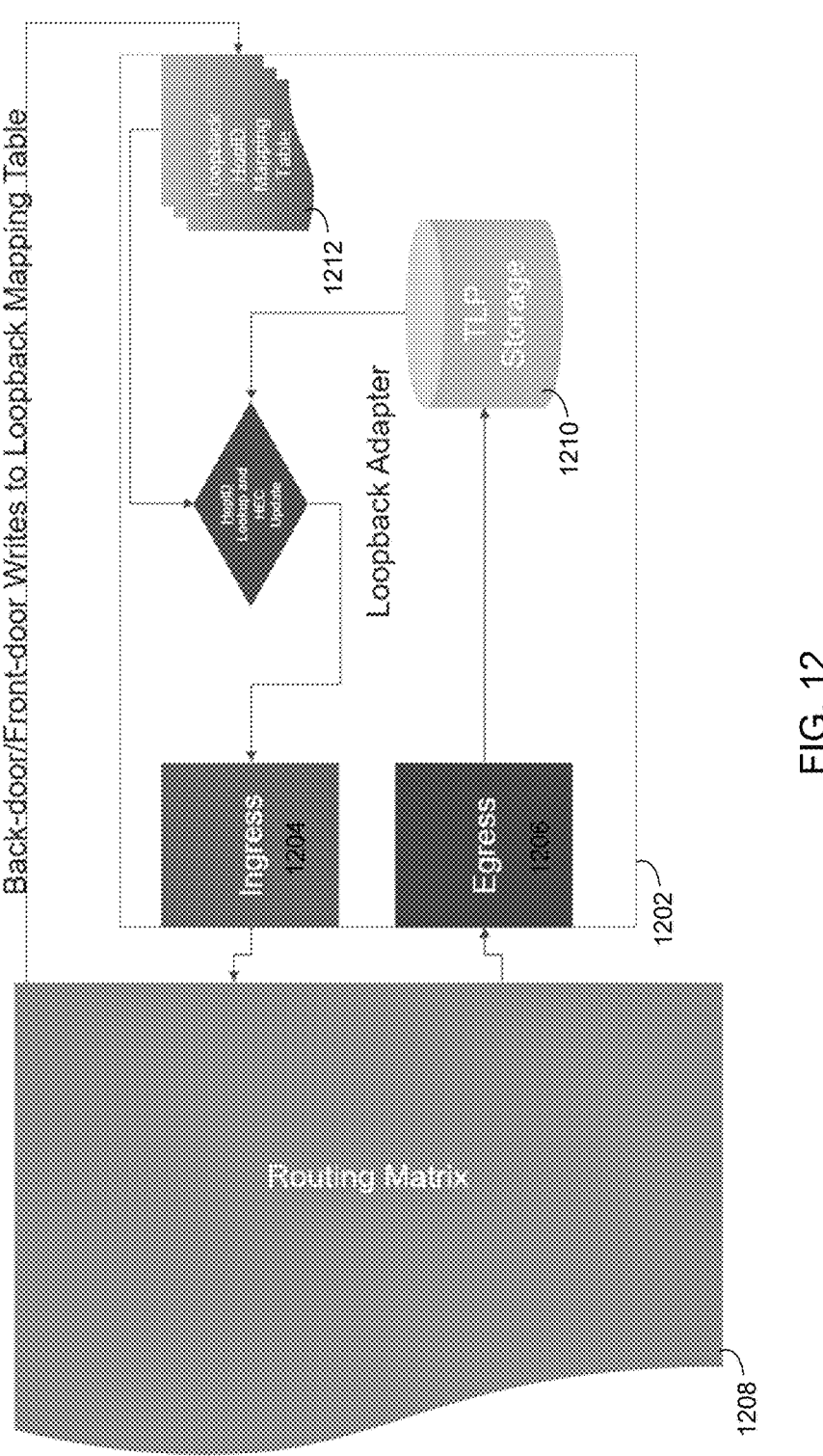
FIG. 12 is an example showing a routing matrix and loopback adapter according to an embodiments of the present disclosure.

Referring now to FIG. 11, a flowchart 1100 showing exemplary operations consistent with embodiments of routing process 10 is provided. In some embodiments, some or all paths and path attributes/properties may be stored 1102 at a routing table. The process may determine 1104 whether or not a particular path is valid and, if so, the path setup process may initiate 1106. During path setup some or all of the paths between adapter pairs may be configured and setup across the routing matrix using a two-pair phase protocol. If the path is not valid a path teardown operation 1108 may be performed where a selected valid path may be tore down using a multi-phase protocol. If the path is deemed valid any incoming TLPs in the ingress port may be stored 1110 at an internal buffer. This internal buffer may receive data from an adapter or external stimuli. If any packets are pending, the process may perform packet transfer which includes a multi-phase packet transfer 1112 in which multiple packets may be transferred simultaneously between multiple adapter pairs.

Embodiments of the routing process described herein provide numerous advantages over existing approaches. Routing process 10 is a high availability approach as all ingress ports may maintain active connections with a single egress port at one time, for a total of N connections for N total adapters. The overall packet transmission may be broken into different phases. This implies that both the ingress and egress adapters are free to pursue more than one transfer request. This helps with the prioritization logic on the egress side, which can now receive multiple active requests and decide on the priority.

Embodiments of routing process 10 are highly scalable, and can scale as much as the total number of ports in the router. There is no single bottleneck, the processing is modular and the implementation logic is spread through multiple units, which allows this solution to easily scale for many ports. Embodiments included herein provide many options to extend functionality as the number of parameters may be varied, including on the actual packet side. If the packets can be fragmented, then even large packets can be supported over the active link with no latency.

Embodiments of routing process 10 are emulation friendly as there are no large multi-port memories in this solution, which makes it relatively easy to compile, place and route with great critical path (step count), and low gate area consumption. Since there are no software components which can stop emulator clocks, routing process 10 may be able to operate at the maximum frequency possible with no interruptions. All of the logic proposed operates at the same clock as the protocol, so there are no faster clocks introduced, and thus no slow down the design execution on the emulators.

Embodiments of routing process 10 provide a high throughput solution. There is an initial latency while the first few requests go through, however once the transmission starts there is zero latency, and the ingress and egress adapters may continue to batch and send multiple packets across the link without any clock delays. Also, since the request and packet transmission phases are pipelined, there is no further latency added. In this way, the routing matrix can keep up with the theoretical maximum bandwidth of the protocol.

Embodiments of routing process 10 provide a customizable solution, and since most of the logic in the ingress and egress adapters is available locally, it is very easy to customize, by adding more parameters or options in both the request and packet transmission phases. The individual ingress and egress behavior may be programmed and the routing matrix architecture does need to be altered in the event the users wish to add new kind of requests, as the routing matrix simply copies over the request from ingress to egress ports.

Embodiments of routing process 10 is faster and more de-centralized than existing approaches, allowing for the solution to scale very easily. There is no hardware to software translation requirement and the solution can work at very low abstractions. Also, since the proposed solution uses very small independent memories to store the data, it is much easier to partition the design, which works very well for emulation use-models. The protocol is transactional in nature and allows for both initiator and target to perform other operations if the path is busy, or the other entity is busy. The packet exchange protocol allows the target to determine the priority of the incoming paths and then request the packet from the initiator. As the initiator has already notified of the number of packets available for transmission, the packet exchange phase has very high availability. Embodiments included herein require minimal buffering in the targets, while there is no need for priority management in the initiators. This greatly simplifies the RTL design logic, and makes the whole implementation highly modular and simple to implement.

Referring now to FIGS. 12-23, embodiments of the present disclosure directed towards a loopback adapter process 11 are provided. As is also provided in FIG. 3, modern communication interfaces like USB4 are more than a collection of simple one-to-one connections. These devices act more like network routers. When a customer wants to test their own USB4 Host or device on an emulation platform (such as those available from the Assignee of the present disclosure), they would need the corresponding pair device or host component to push traffic on to their Design Under Test (DUT). Designers may create verification components called Accelerated Verification IP (AVIP), with the primary goal of pushing as much data as allowed on to the DUT running on the emulator platform from the software side, and simultaneously obtain as much data as possible from the DUT and providing the user with an API to drive/receive this traffic on the simulator side.

The DUT running on emulators platforms, typically would operate on the fastest design clock frequency it was compiled to, but with an AVIP trying to interact with the Software layers, the design clock has to stop to allow the software to catch up with the emulator platforms. The less frequent these interruptions happen, the faster the DUT can operate leading to lower verification turnaround.

Specifically, for USB4, the protocol can tunnel other protocols like DisplayPort, PCIe, and USB3, over the USB4 fabric. And a single USB4 device may have multiple instances of these tunneled protocol instances (called adapters/ports) connected to one USB4 adapter port. And there can even be more than 1 USB4 Adapter in a device, for a hub like configuration, with one Adapter acting as an upstream port, and the other downstream. The main controller of this hierarchy is called a configuration manager (CM), which is at the top of the hierarchy operating inside a USB4 Host. The USB4 uses a common data structure called Transport Layer Packet (TLP) which is the unit which is transported across different protocol adapters and between different routers and amongst different routing domains. These TLPs are routed amongst the different Protocol Adapters, allowing the tunneled traffic to reach their destination from USB4 port.

USB4 protocol also allows multiple chips to form a hierarchy in the real world. With a single CM configuring the complete hierarchy or with multiple CM controlled domains conversing in a peer to peer manner. This makes testing and verifying the routing logic and the underlying algorithms nearly impossible without two or more routers interacting in the same hierarchy.

Accordingly, embodiments of loopback adapter process 11 provide a mechanism to implement these complicated verification scenarios within a single router. The intention is to add run time configurable delays and allow path changes to packets within a single routing application using protocol agonistic loopback adapters which may be configured at runtime to mimic verification scenarios in a protocol compliant manner.

Figure 13:
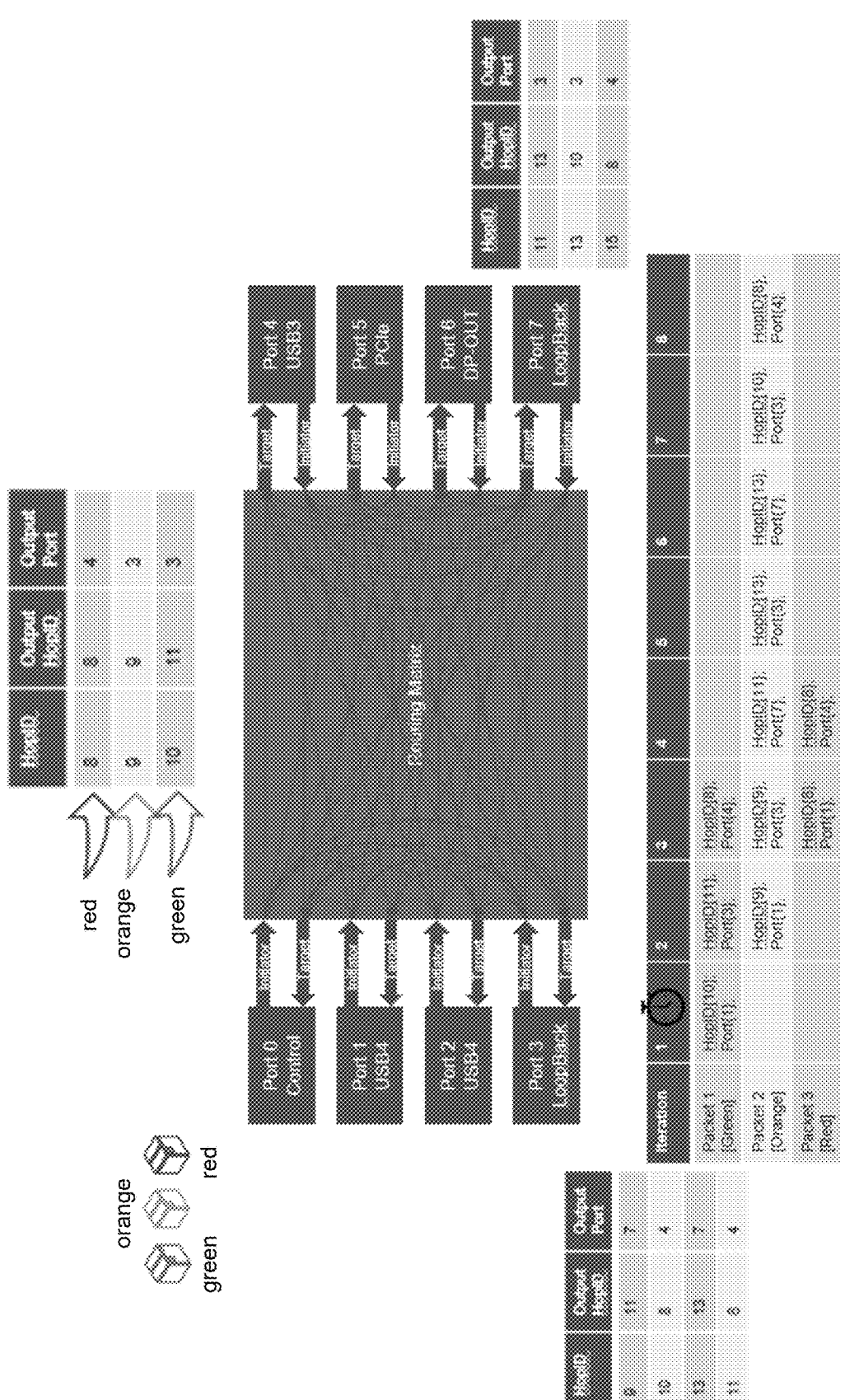
FIGS. 13-22 show examples of routing matrices and routing tables according to embodiments of the present disclosure.

Referring now to FIG. 13, a diagram 1300 showing an example consistent with embodiments of loopback adapter process 11 is provided. For the transport layer, the design may be split up into two major parts. The first is the individual protocol adapters 1302, with one ingress port 1304 and one egress port 1306 each. The second part is a single module referred to herein as the routing matrix 1308, which may be configured to interface with all the adapters.

In some embodiments, ingress port 1306 may be configured to receive the transport layer packets from the various adapters and store them in local buffers 1310 as per the USB4 protocol. The logical connections called paths are configured by the CM, and these values may be saved in the routing table 1312. Routing table 1312 may include one bit to indicate that the path is active, one unique identifier (referred to herein as "HopID").

In some embodiments, one or more static parameters for a path such as the output adapter number may be included, which once set may remain fixed for the complete duration of path's existence, while there may be others that may change on the basis of the present workload. These may be referred to as dynamic parameters. Since there may be a finite number of unique identifiers, the HopIDs may be reused between different paths. To enable this the unique identifier, HopID can be changed by the ingress port, and this value may be stored within the routing table. In this architecture, the routing table may be stored within the ingress port, and this may include one or more parameters (e.g., from USB4 protocol). Some parameters may include, but are not limited to, valid (e.g., one-bit value to indicate if the path is valid), HopID (e.g., this is a logical name for the Path), Output HopID (the Output HopID for the outgoing packet), Output Adapter Number (this value may be the destination Adapter number, to which the TLPs on this path are supposed to be sent to), priority (this value is the priority of the path and may help decide the path priority at the egress port of the destination Egress port), weight (this value helps avoid a high priority path hogging all bandwidth). The Egress can only schedule TLPs equal to the Weight count in one round, after that paths with lower priority are selected.

In some embodiments, the HopID may be the unique identifier, Output Adapter Number and Priority may be static parameters and the weight may be a dynamic parameter which may be changed even after the path has been activated.

In some embodiments, and as shown in FIG. 13, the present disclosure may include one or more loopback adapters 1302. Loopback adapter 1302 may be configured so that the overall infrastructure cannot distinguish between loopback adapter and the other protocol adapters.

In some embodiments, loopback adapter 1302 may be used to create myriad path configurations. Internally, loopback adapter 1302 may include a set of compile time defined hardware buffers. Each of these may represent a possible path for the transport layer packets coming in from the transport layer. Then, based on the configuration parameter, the transport layer packets may either be routed to a new path, by changing the HopID and output port number, duplicated a predefined number of times, or simply terminated. This allows the loopback adapter 1302 to mimic the behaviour of a real-world adapter, with very low latency. The behaviour of every path may be completely configurable, and may be altered continuously, using either a software backdoor register write through a software API, or programmed by the front door control transactions using the USB4 Host. The control and configuration space may follow the standard USB4 register size definitions in some embodiments.

In some embodiments, loopback adapter 1302 may include ingress and egress adapters, which may be configured similarly to other protocol adapters. Loopback adapter 1302 may further include internal buffers and configuration unit. The total number of internal buffers may be determined at compile time and are user-defined parameters. The buffer depth may also be a compile time parameter, and may be the same for all the paths. Typically every HopID expected from the transport layer should have a single buffer path. Loopback adapter 1302 may also allow for HopID values between 1-7, which may be typically reserved for USB4 control and configuration and may be dropped by other protocol adapters.

In some embodiments, control port FIG. 6 may be configured to program the configuration registers (within adapter), two 32 bit registers per Path/HopID. The registers may be programmable from the frontdoor, at address 2*HopID, and 2*HopID+1. Loopback adapter process 11 may be configured to store a plurality of fields. Some of these may include, but are not limited to, valid Bit (to indicate if the path is active and valid. If this bit is set to 0, all transport layer packets received on this HopID are dropped from further processing), Output HopID (this 10-bit value indicates the Output HopID. When the transport layer packets are queued up in the buffers, the HopID within the transport layer packet header are changed with this value, and the ECC updated), Output Adapter (this value indicates the Output Adapter on which the transport layer packets for this particular Path are to be routed to. This value should be a legal value and should be less than the Max Router adapter. If this is not a legal value, the transport layer packets may be stored, but dropped when it is time to route them back on to the ingress), Repeat Count (n) (this 8-bit value is typically set to 1, but if set to more than 1, then on the Output path the transport layer packets are repeated n times), Delay (this value is set to 0 by default, but any non-zero value indicates an additional delay in sending every transport layer packet back on to the ingress port. The 24-bit delay value is in terms of transport layer clocks).

In some embodiments, the transport layer packets from the other adapters to the loopback adapter may be received on the egress port. The transport layer packet Header Dword may then be decoded, validated against the 8-bit ECC checksum, if there are 1-bit error, then they are fixed. Based on the incoming HopID value, appropriate configuration registers at address 2*HopID and 2*HopID+1 may be read. If the path bit "Valid" is set, then the transport layer packet may be queued up in the local buffer. When the transport layer packet is queued up, the associated local delay and repeat values may be duplicated based on the "Delay" and "Repeat" configuration values set in the configuration register. Accordingly, if these are updated later, even then only the values which were in effect, at the moment of transport layer packet arrival, are taken up.

In some embodiments, the local buffer scheduling may address the transport layer packet delay configured in the registers, and on every clock positive edge, the local delay counter for the oldest transport layer packet in the buffer may be reduced by one. When the delay counter for the transport layer packet sets to 0, the transport layer packet may be sent for scheduling. On the ingress path, all the stored buffer paths may be checked, and if there is any transport layer packet which is scheduled, then that is copied over to the ingress port, where the usual queueing process takes place. If the repeat value for this transport layer packet is set to 1, then the transport layer packet may be removed from the buffer, otherwise the local repeat counter may be reduced by one, and the transport layer packet may continue to reside in the local buffer. In this manner transport layer packets may flow internally through loopback adapter 1302.

In some embodiments, loopback adapter 1302 may be configured in several different arrangements. Using a front-door arrangement, the USB4 router application may be connected to the device and may address the loopback device using control read/write transactions. The registers may be addressed in a similar manner to the other protocol adapters. In a backdoor arrangement, every loopback adapter may be programmed directly using the DPI API provided with the AVIP.

Referring now to FIGS. 13-22, examples consistent with loopback adapter process 11 are provided. FIG. 13 tries to visually represent one scenario, in which the packets are routed between USB4 (Port 1) and USB3 (Port 4). FIGS. 14-22 show the step-by-step routing for this scenario. In this example, three different packets with three different HopIDs may arrive at Port1, and the end result at Port 4 is indistinguishable, and all packets arrive with HopID 8. However, the arrival times may differ as Orange packet is bounced between Loopback Adapters (Port3 and Port7), the Green is stored in Loopback adapter 3 and then passed on to Port4, while Red takes a direct path.

These examples depict 8 different clock intervals in a sequence. In these figures the table at the bottom represents the values of the three differently colored packets that are being traced, while the three tables besides the Port 1, Port 3 and Port 7 depict the values stored in the respective routing tables.

In this example for simplicity, delay and repeat are set to 0 for all Loopback adapter tables. When "Delay" is set to "d", the packet may not be sent back on the next iteration but would be stored within the Loopback adapter storage until the delay counter expires ("d" clock intervals). Likewise, if the "Repeat" is set to non-zero value "n", the packet is repeated "n-1" times with the delay counter resetting on every set.

Figure 14:
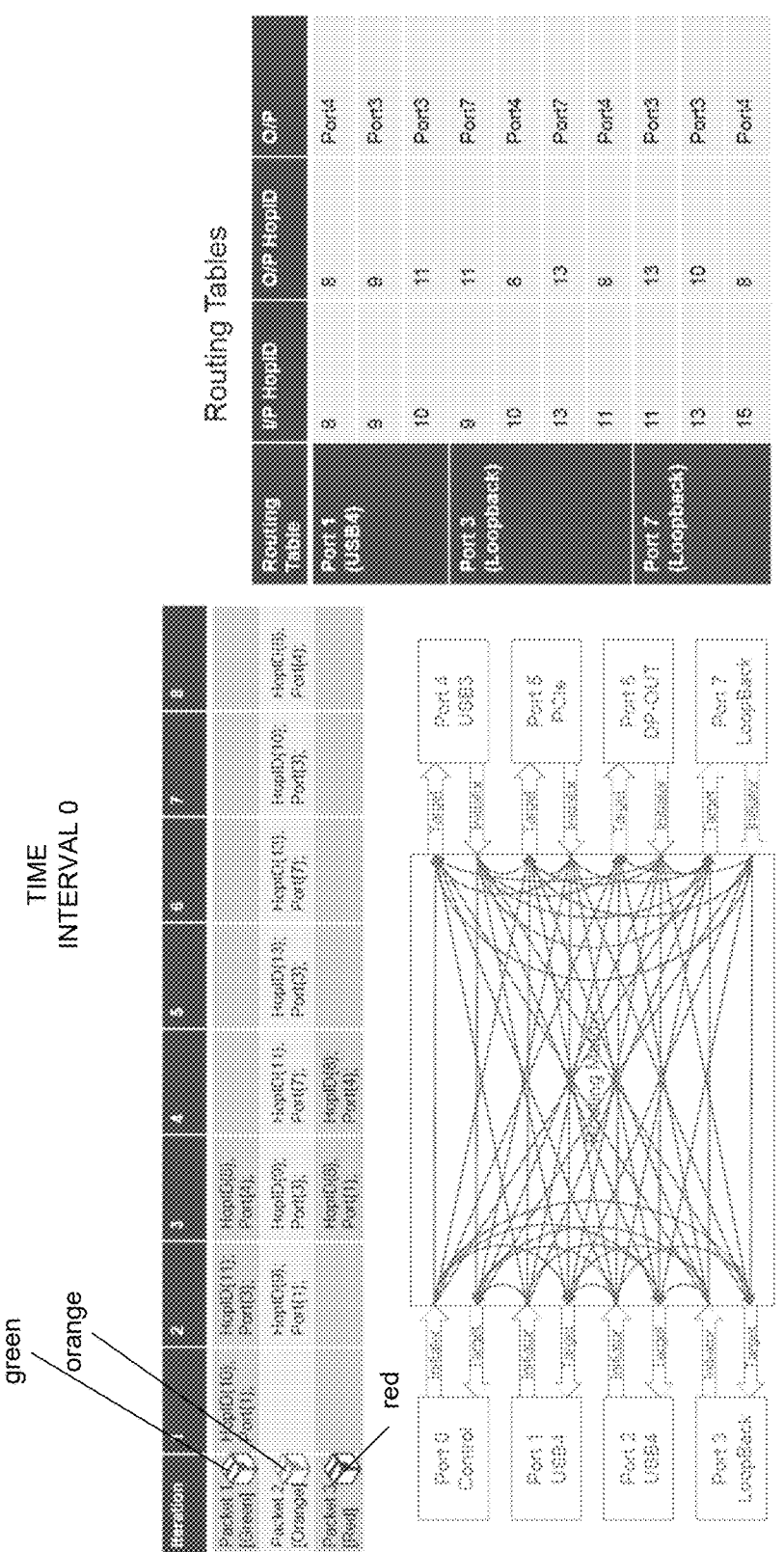

Iteration #0: FIG. 14

When the scenario starts, the Green, Orange and Red packets will arrive at the Port1 (USB4) from a DUT (Design under test). These packets can represent any TLP, from routing perspective they are all supposed to arrive at Port4 (USB3). The composite routing table on the right simplifies the visualization, while in actual implementations, the table are distributed, and reside within each adapter port. The table at the top "Iteration" will mark individual clock interval and the state of the packets at those intervals.

Figure 15:
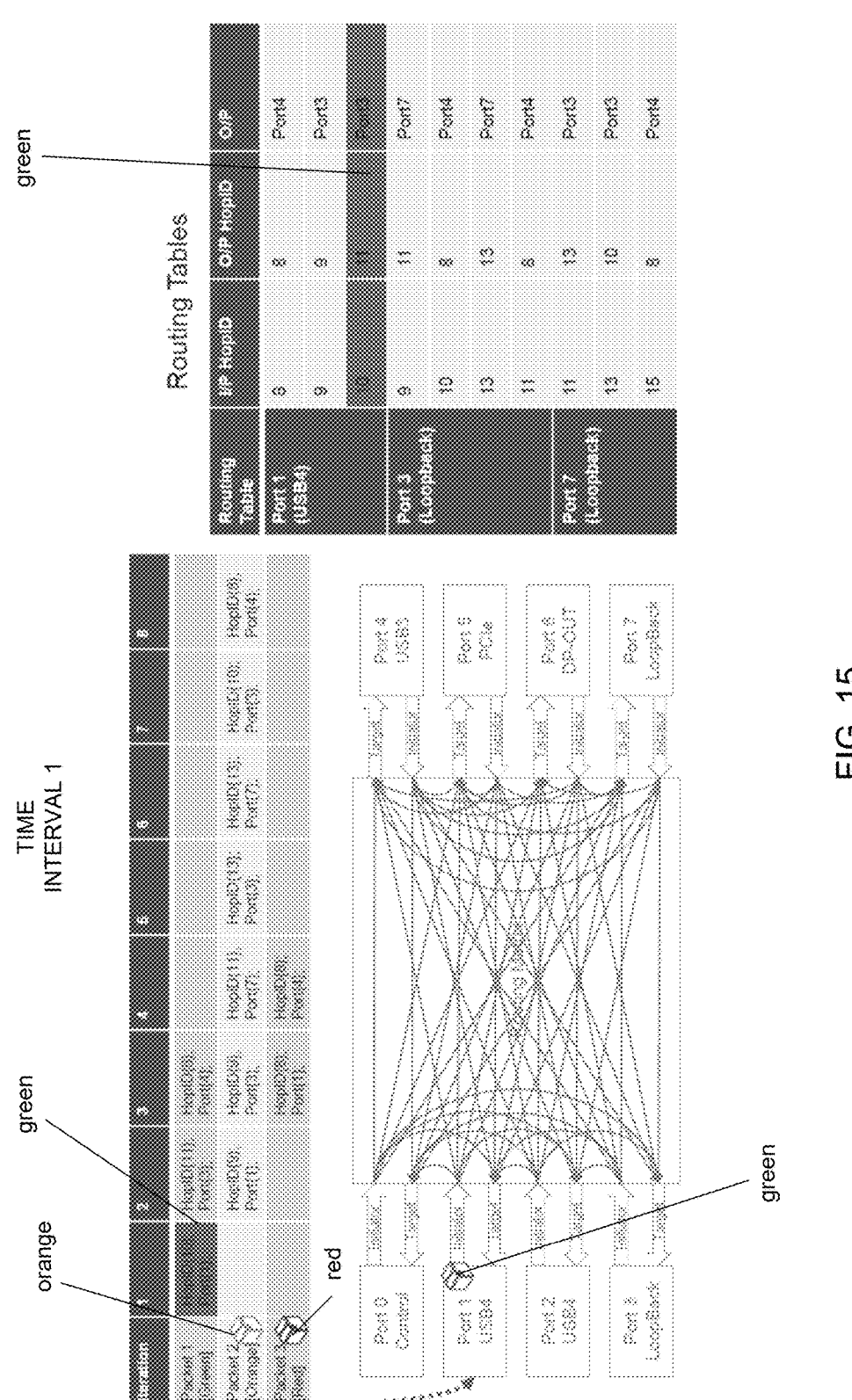

Iteration #1: FIG. 15

[Green Packet]: [Port1, HopID 10]

The green packet arrives at USB4 Port 1, with HopID 10. This packet will hit the Row #3 of the routing table and its HopID will change to 11 in the next iteration, while it will be sent to Port3, as mentioned in the "O/P" field of the Routing table, highlighted with the Green bar

[Orange Packet]: Not arrived as yet

[Red Packet]: Not arrived as yet

Figure 16:
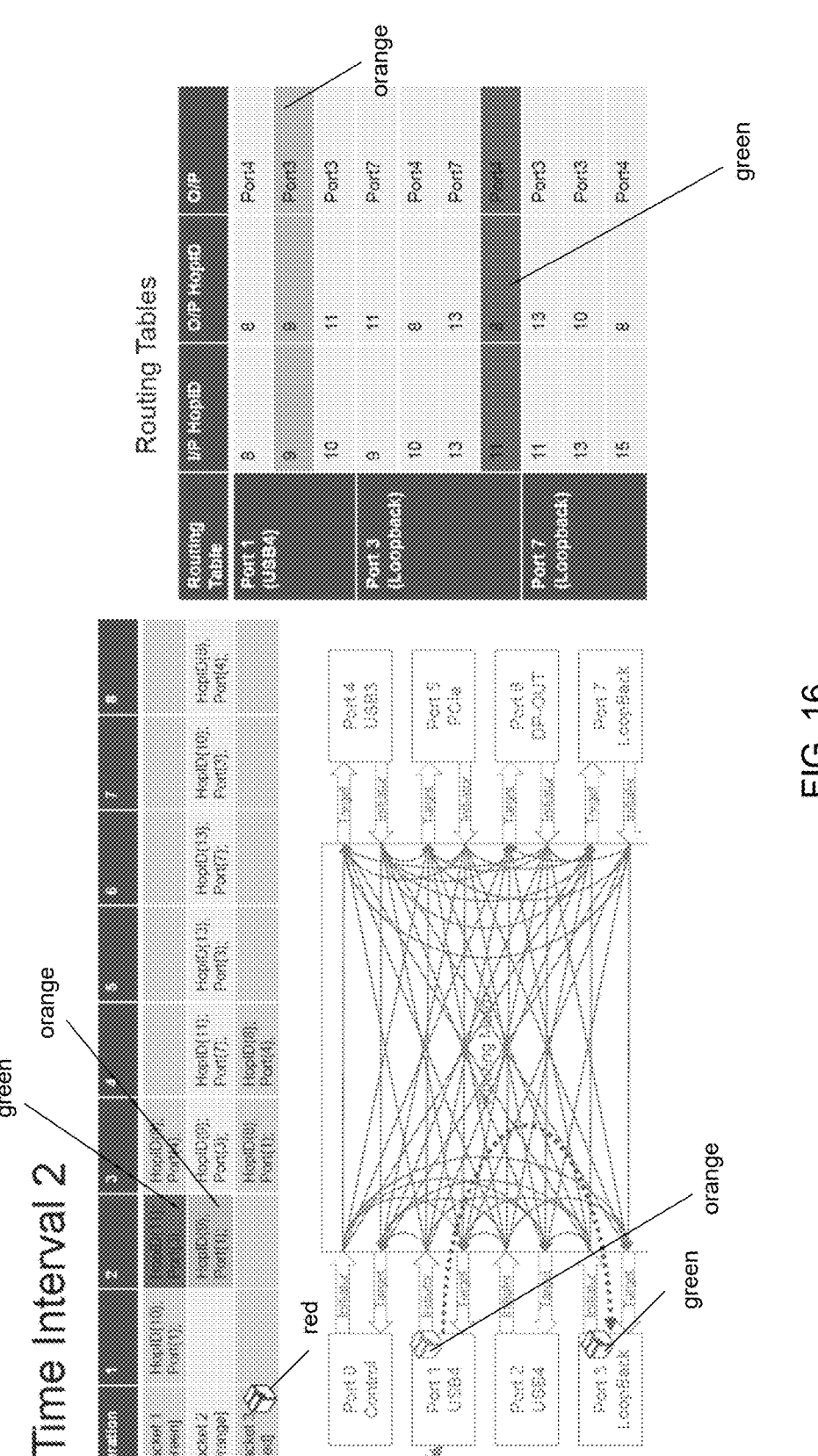

Iteration #2: FIG. 16

[Green Packet]: [Port3, HopID 11]

The Green packet arrives at the Port3 (Loopback) as marked with the dotted green arrow, where it will hit Row4 of the routing table, and in the next iteration, it will be directed to Port4, and its HopID changed to 8, as highlighted in the Green bar in the Routing Table.

[Orange Packet]: [Port1, HopID 9]

The Orange dotted arrow marks the arrival of the Orange packet at Port1, but this time the HopID is 9, which should also be routed as per Row #2 of the Port1 routing table highlighted with an Orange Bar. As per the routing table information the HopID remains unaltered 9, and it will be directed to Output Port3.

[Red Packet]: Not arrived as yet

Figure 17:
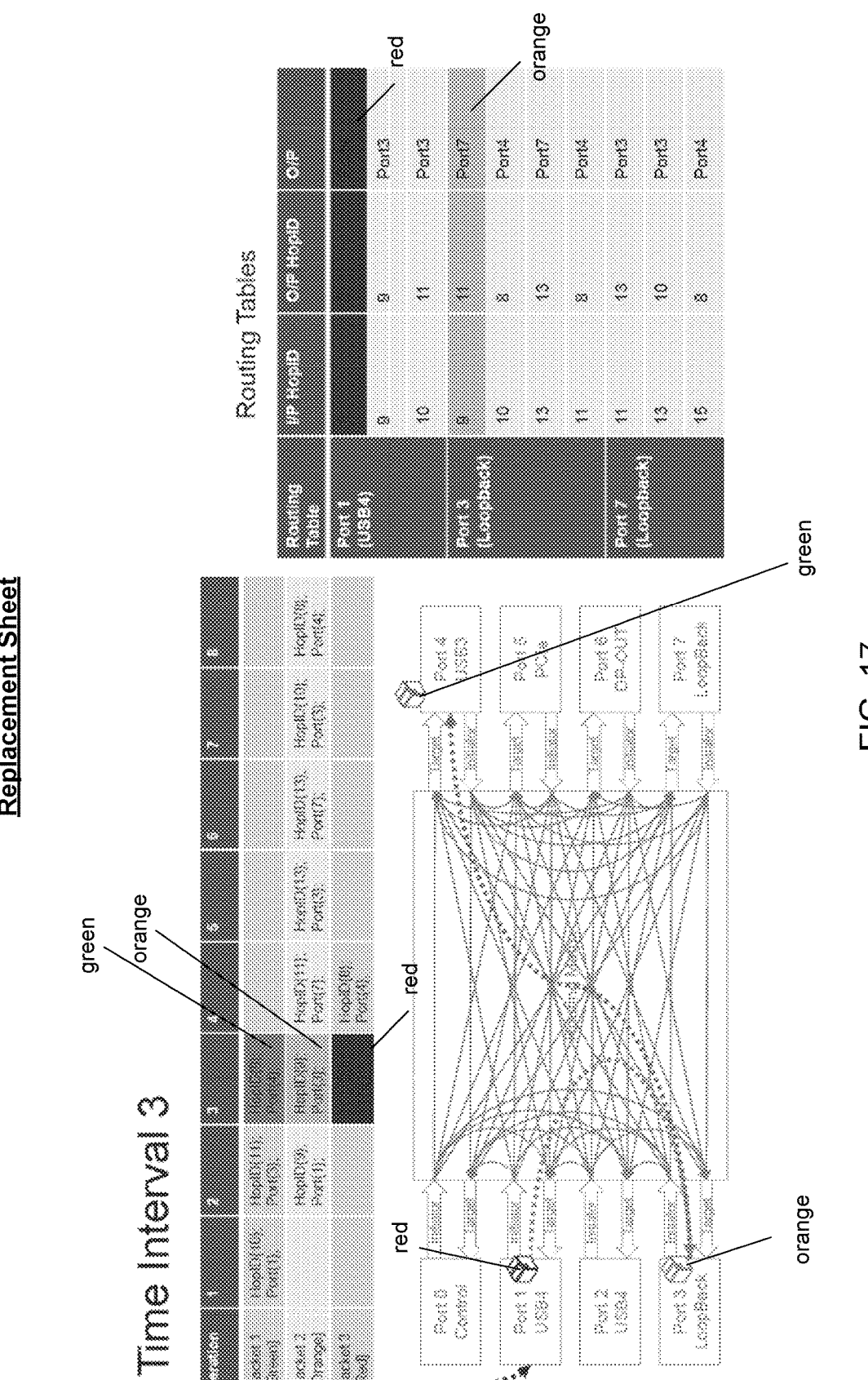

Iteration #3: FIG. 17

[Green Packet]: [Port4, HopID 8] The green packet starts its journey in this iteration from Port 3 as shown by the Green Arrow, and this packet arrives at destination Port 4, here this packet is saved or passed on for further processing to the USB3 layers (not shown in routing table).

[Orange Packet]: [Port3, HopID 9] Orange packet in this iteration starts from Port 1, and arrives at Port3, which is a Loopback adapter. When it arrives at the Loopback adapter it hits row #1 in the Port 3 routing table as shown by the Orange bar in the routing table and its HopID is updated to 11, while it will be sent to Port7 in the next iteration.

[Red Packet]: [Port1, HopID 8] As shown by the Red dotted arrow, the Red packet arrives at Port1, and hits the row1 in the Port1 routing table. Its HopID remains same, but the output port destination is Port4 as highlighted by the red bar in the Routing table.

Figure 18:
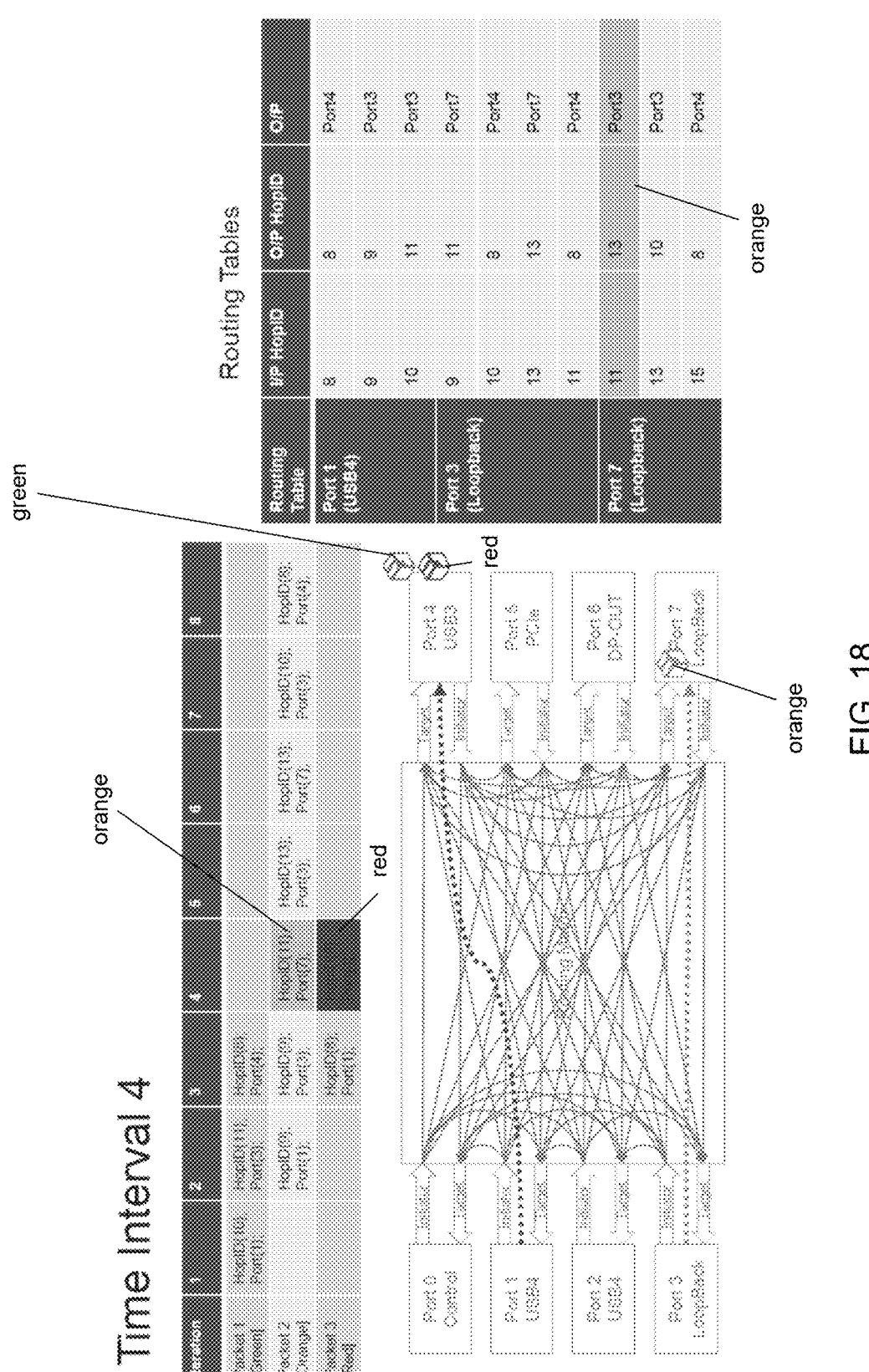

Iteration #4: FIG. 18

[Green Packet]: [Port4, HopID 8] Packet already arrived at Port 4.

[Orange Packet]: [Port7, HopID 11] The orange packet traverses from Port3 and is directed to the other Loopback adapter Port7. This time the HopID also changes from 9 to 11, and this hits the Row1 in the Port7 routing table.

[Red Packet]: [Port4, HopID 8] The Red packet in this iteration arrives at Port 4 with HopID 8 as shown with the Red Dotted arrow.

Figure 19:
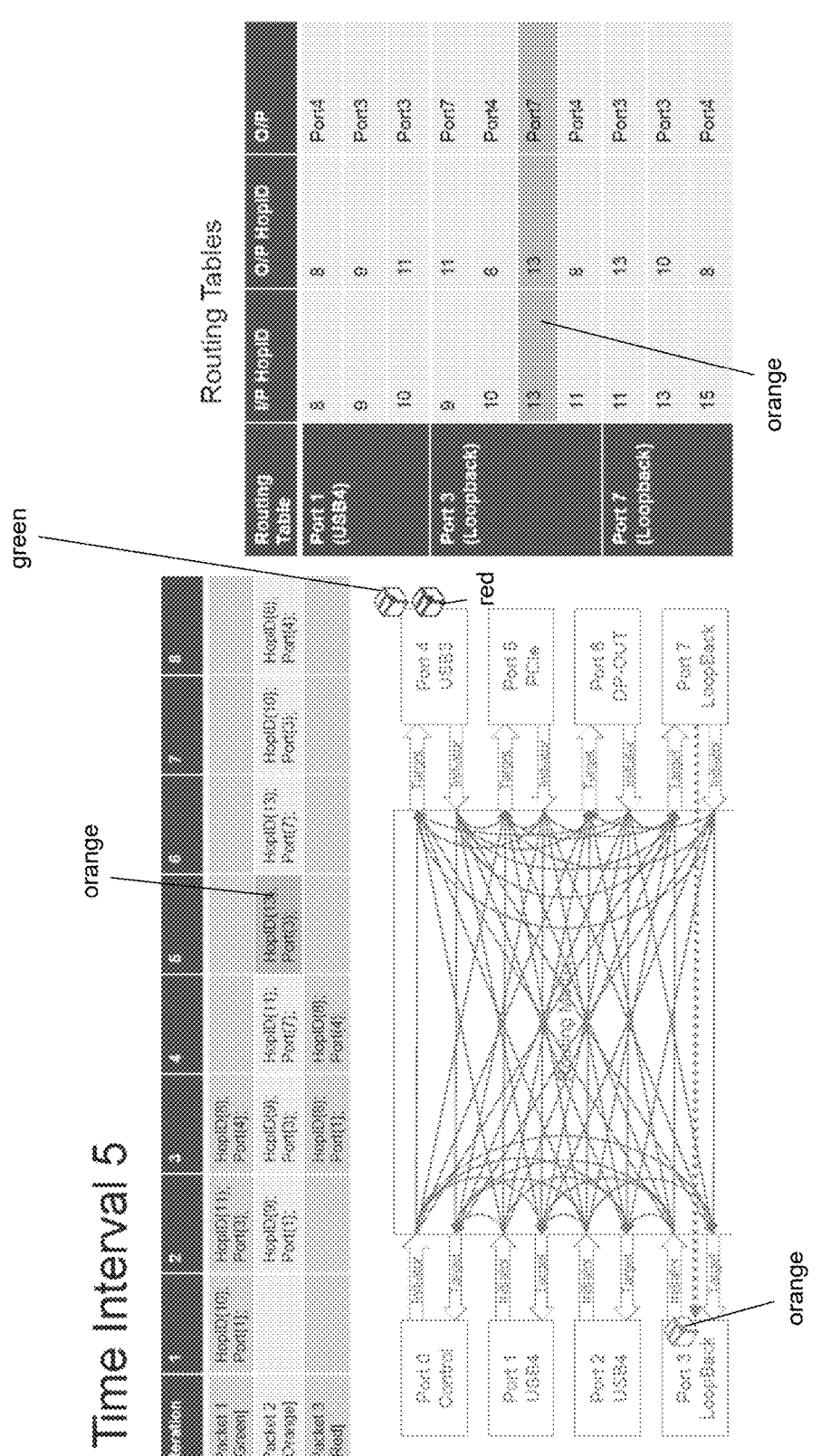

Iteration #5: FIG. 19

[Green Packet]: [Port4, HopID 8] Packet already arrived at Port 4.

[Orange Packet]: [Port3, HopID 13] The orange packet with HopID 11, starts from Port 7, and is bounced back to Loopback adapter Port3, but this time the HopID is unaltered at 13, which hits the Row3 in the Port3 routing table as highlighted by the Orange bar in the routing table.

[Red Packet]: [Port4, HopID 8] Packet already arrived at Port 4

Figure 20:
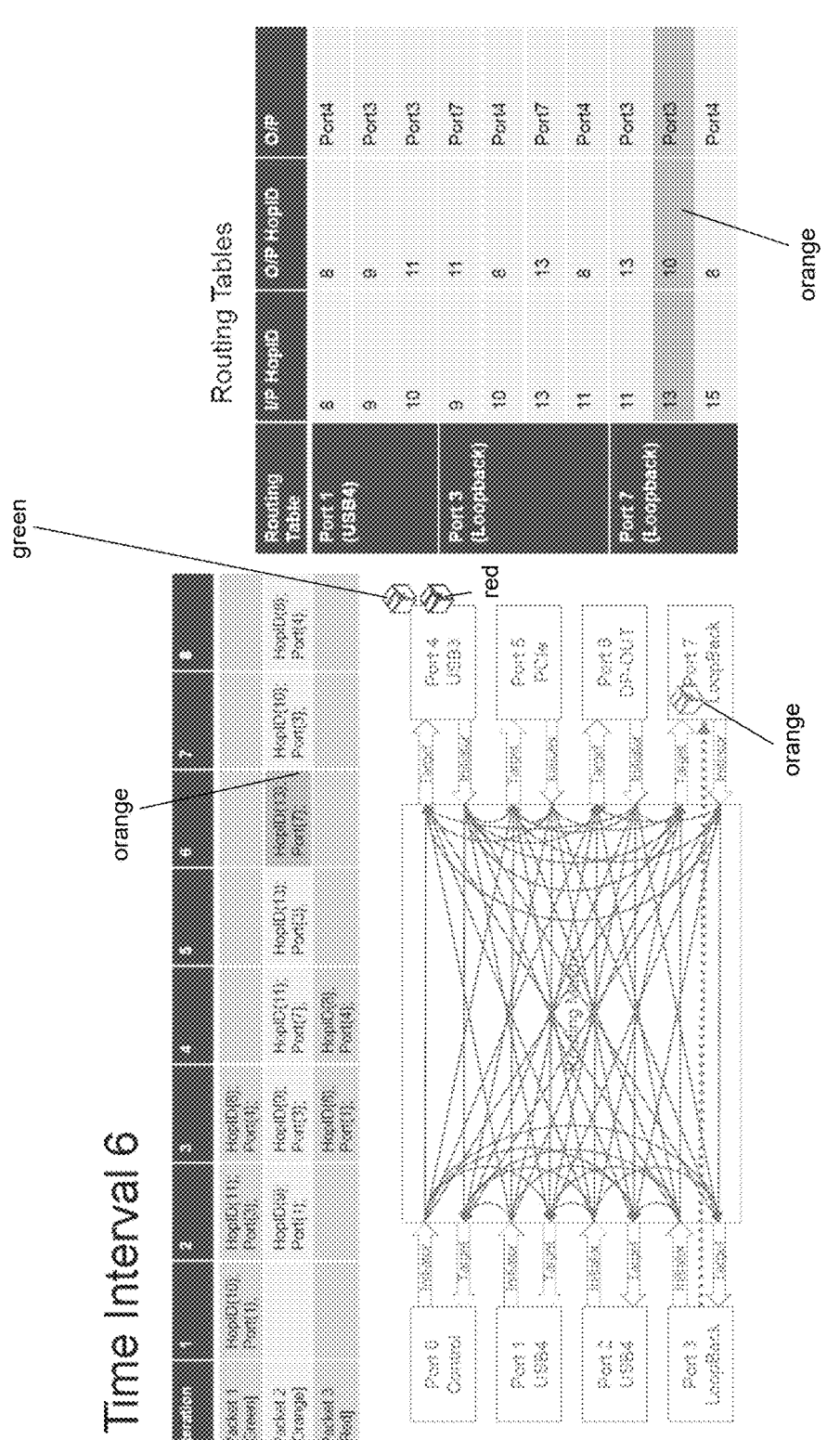

Iteration #6: FIG. 20

[Green Packet]: [Port4, HopID 8] Packet already arrived at Port 4.

[Orange Packet]: [Port7, HopID 13] In iteration 6, the packet is at Loopback adapter Port3, and is transmitted back to Port7, this time the HopID will be changed to 10, for the next iteration.

Figure 21:
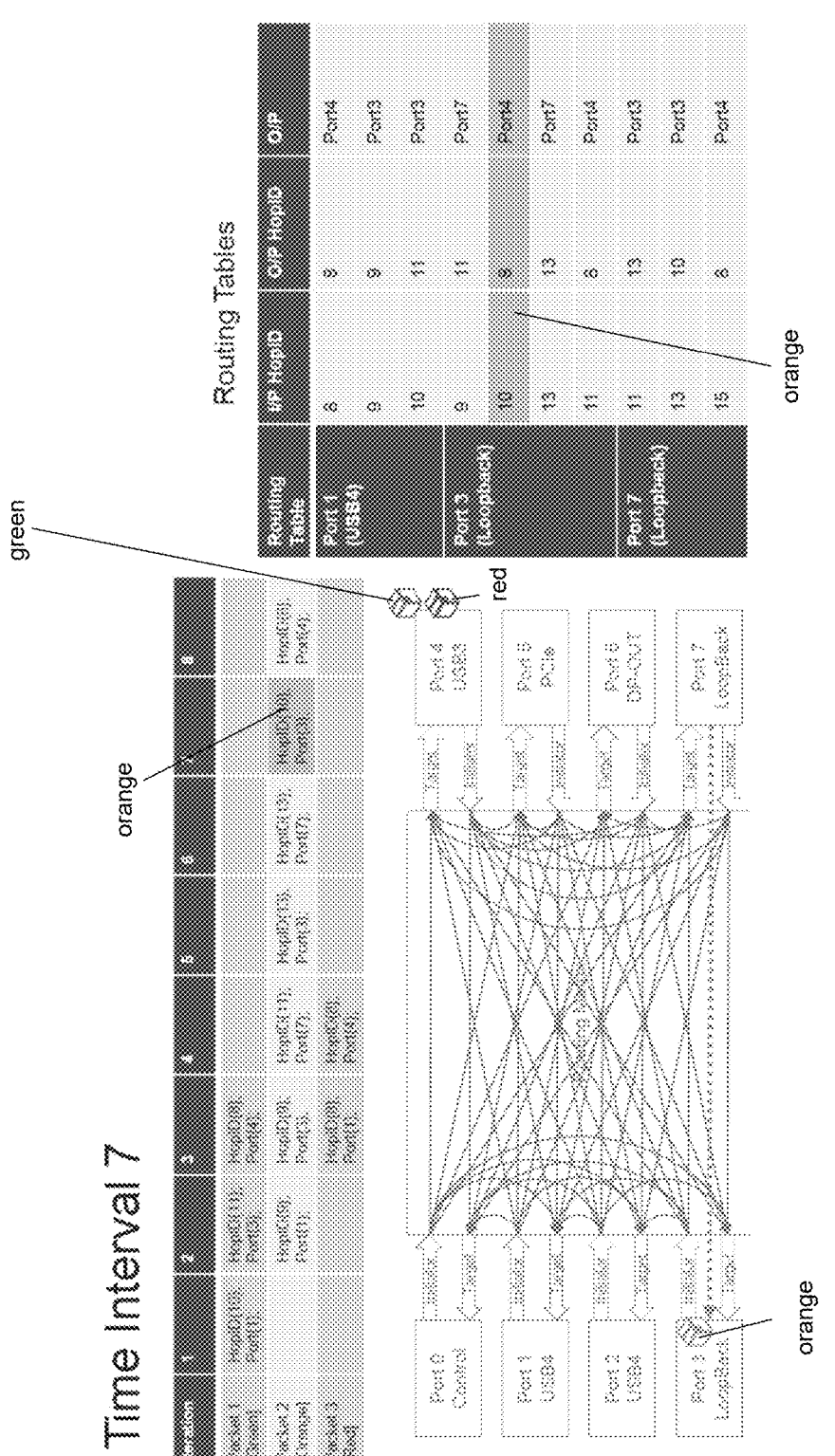

[Red Packet]: [Port4, HopID 8] Packet already arrived at Port 4 Iteration #7: FIG. 21

[Green Packet]: [Port4, HopID 8] Packet already arrived at Port 4.

[Orange Packet]: [Port3, HopID 10], The orange packet arrived with HopID 10 at Port3 and hits Row2 in Port3 routing table. This will change to HopID 8 in the next iteration and is destined to Port4. So even though the same packet arrived at Port3, and Port7 multiple times, the destination is different every time. It is possible to create closed loops while routing and this has to be taken care of at the Host end, which programs the routing tables.

[Red Packet]: [Port4, HopID 8] Packet already arrived at Port 4

Figure 22:
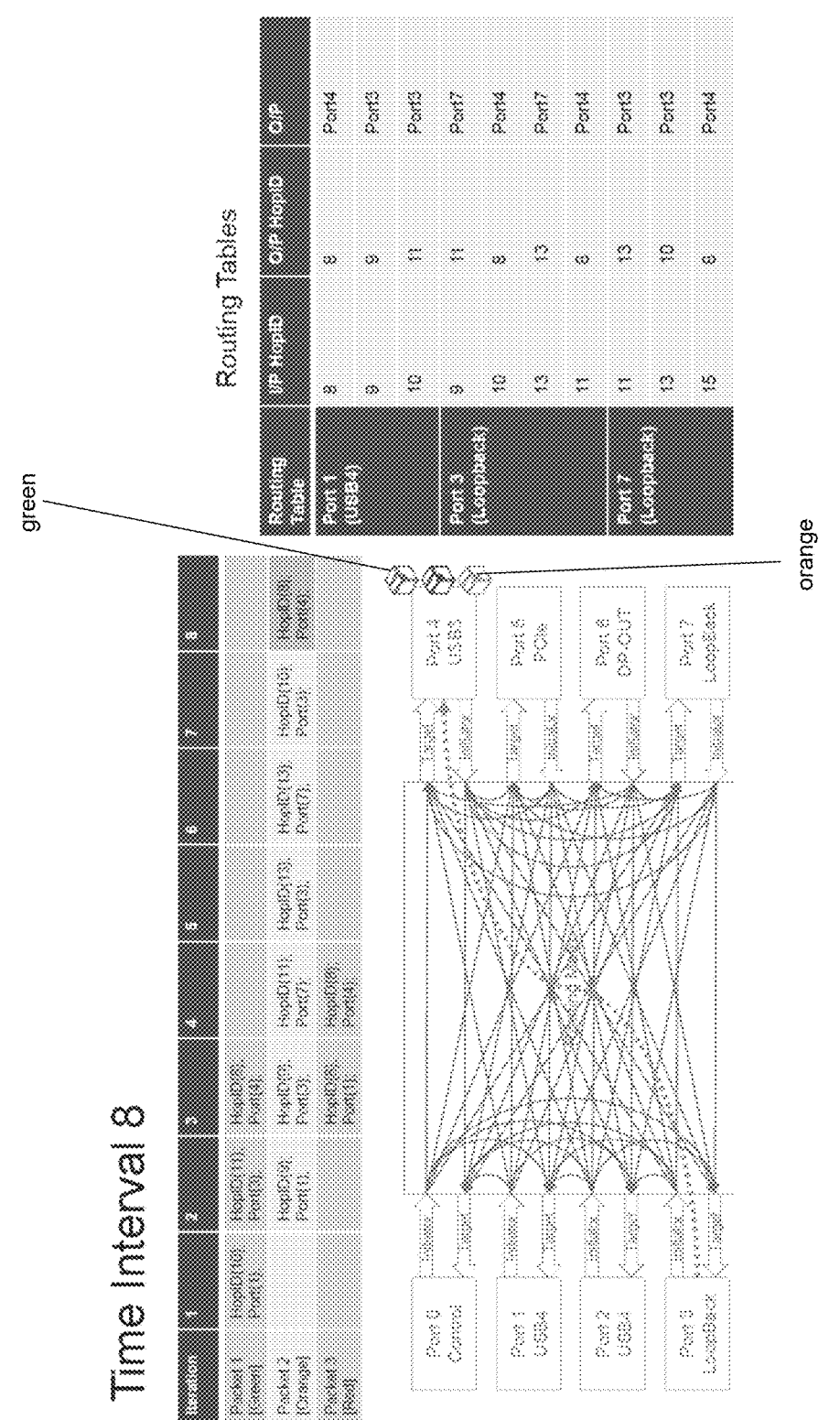

Iteration #8: FIG. 22

[Green Packet]: [Port4, HopID 8] Packet already arrived at Port 4.

[Orange Packet]: [Port4, HopID 8] In this last iteration the orange packet at Port3 traced by the Orange dotted arrow from Port 3.

[Red Packet]: [Port4, HopID 8] Packet already arrived at Port 4

As seen here even though the packets arrived at consecutive intervals at Port1, the order of arrival is significantly different because the orange packet was bounced multiple times between Port3 and Port7, while Green was reflected only once, and the Red packet was transmitted directly. This was made possible by using a pair of Loopback adapters.

Referring now to FIG. 23, a flowchart depicting an embodiment consistent with loopback adapter process 11 is provided. The method may include routing 2302 one or more transport layer packets through a routing matrix and communicating 2304 with the routing matrix via a plurality of ports, wherein at least one of the plurality of ports includes a loopback adapter. The method may further include transmitting 2306, via the loopback adapter, one or more transport layer packets to a storage unit, the loopback adapter including a unique identifier mapping table in communication with the routing matrix. Numerous other operations are also within the scope of the present disclosure.

In some embodiments, a large improvement may be achieved by adding more than one loopback adapter in the configuration. With more than one adapter, the transport layer packets may be bounced back amongst these multiple times. Every time the HopID values can be updated, and new virtual paths can be created which can create paths with very long delays or adding more than one transport layer packet for every single transport layer packet added. In some embodiments, more than three adapters may be used, and they may be configured to mimic scenarios which would not be possible without adding many USB4 devices. It should be noted that the scenarios are completely reproducible, while this is very difficult to coordinate with real devices.

In some embodiments, loopback adapter 1202 may be implemented entirely in register transfer level RTL and may not need to communicate back and forth with the software layers hence the transport layer packets may be routed or duplicated with no delay. Optionally, the transport layer packets may be programmed to be sent back with custom delay. This may lead to simulating a wide variety of real-world situations with no software execution overhead.

Embodiments of loopback adapter process 11 are highly scalable and may scale as much as the total number of ports in the router. Also, per adapter, the number of paths that may be configured may also be compile time defined, and since the USB4 protocol allows up to 10 bit HopID, the users may define as many as 1024 paths per loopback adapter, though the real-world applications would generally use only 10 s of paths per adapter.

Embodiments of loopback adapter process 11 include no large multi-port memories in, which make it relatively easy to compile, place and route with great critical path (step count), and low gate area consumption. Additionally and/or alternatively, since there can be no software components, should a user wish to program the adapters using only front door control writes, which can stop emulator clocks, the solution will be able to operate at maximum frequency possible with no interruptions. It should be noted that all of the logic proposed operates at the same clock as the protocol, so there are no faster clocks introduced, to slow down the design execution on the emulators.

Embodiments of loopback adapter process 11 may include more than one loopback adapter in a single USB4 device. This may allow users to mimic a wide variety of networks and test the priority resolution and bandwidth negotiation logic without adding a second USB4 device in the testbench. Some or all of the logic and the complete protocol may be visible in the waveforms at a graphical user interface and may be easily debuggable unlike a software or CPU based solution.

Many existing approaches face problems with complicated routing topologies particularly with reproducing the same behavior to test a fix, or an alternate implementation. Embodiments of loopback adapter process 11 may address this problem since the registers, and the complete RTL logic works the same every time, and there are no issues with software induced delays, priority resolution issues, or latency between multiple devices. So, while almost all possible scenarios may be created, they are always reliable, and easily reproducible.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A system comprising:

a routing matrix configured to route one or more transport layer packets; and a plurality of ports configured to communicate with the routing matrix, wherein at least one of the plurality of ports includes a loopback adapter configured to store and transmit one or more transport layer packets to a storage unit, the loopback adapter including a unique identifier mapping table in communication with the routing matrix, wherein the routing table includes an input unique identifier, an output unique identifier, and an output port identifier, wherein the loopback adapter is configured to receive a transaction from the transport layer on a first unique identifier and to transmit it back to the transport layer on a second unique identifier and wherein the loopback adapter is configured to duplicate, re-route, delay, alter, or terminate the one or more TLP packets.

2. The system of claim 1, wherein the plurality of ports includes a plurality of loopback adapters.

3. The system of claim 1, wherein the loopback adapter is configured to store a plurality of incoming unique identifiers in a buffer.

4. The system of claim 1, wherein the loopback adapter is implemented at a register transfer level.

5. The system claim 1, wherein the plurality of ports includes one or more universal serial bus ("USB") ports, Displayports ("DP"), or peripheral component interconnect express ("PCIe") ports.

6. The system of claim 1, wherein the loopback adapter is configured to perform a header error checksum ("HEC") update.

7. The system claim 1, wherein the output unique identifier is transmitted along a different path from the input unique identifier.

8. A method comprising:

routing one or more transport layer packets through a routing matrix;

communicating with the routing matrix via a plurality of ports, wherein at least one of the plurality of ports includes a loopback adapter; and transmitting, via the loopback adapter, one or more transport layer packets to a storage unit, the loopback adapter including a unique identifier mapping table in communication with the routing matrix, wherein the routing table includes an input unique identifier, an output unique identifier, and an output port identifier, wherein the loopback adapter is configured to receive a transaction from the transport layer on a first unique identifier and to transmit it back to the transport layer on a second unique identifier and wherein the loopback adapter is configured to duplicate, re-route, delay, alter, or terminate the one or more TLP packets.

9. The method of claim 8, wherein the plurality of ports includes a plurality of loopback adapters.

10. The method of claim 8, further comprising:

storing, at the loopback adapter, a plurality of incoming unique identifiers in a buffer.

11. The method of claim 8, wherein the loopback adapter is implemented at a register transfer level.

12. The method claim 8, wherein the plurality of ports includes one or more universal serial bus ("USB") ports, Displayports ("DP"), or peripheral component interconnect express ("PCIe") ports.

13. The method of claim 8, further comprising:

performing, at the loopback adapter, a header error checksum ("HEC") update.

14. The method claim 8, wherein the output unique identifier transmitted along a different path from the input unique identifier.

* * * * *